(12) United States Patent
Mallett et al.

(10) Patent No.: US 11,852,703 B2
(45) Date of Patent: Dec. 26, 2023

(54) MAGNETIC RESONANCE IMAGING DEVICE WITH A CONCAVE-SHAPED FIELD GENERATION UNIT

(71) Applicant: Siemens Healthcare GmbH, Erlangen (DE)

(72) Inventors: Michael Mallett, Faringdon (GB); Adrian Mark Thomas, Bicester (GB); Stefan Popescu, Erlangen (DE); Andreas Krug, Fürth (DE); Matthias Gebhardt, Erlangen (DE); Stephan Biber, Erlangen (DE); Andreas Greiser, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/853,093

(22) Filed: Jun. 29, 2022

(65) Prior Publication Data
US 2023/0003816 A1  Jan. 5, 2023

(30) Foreign Application Priority Data

Jun. 30, 2021 (EP) .................................. 21182886

(51) Int. Cl.
| | |
|---|---|
| *G01R 33/38* | (2006.01) |
| *G01R 33/3815* | (2006.01) |
| *G01R 33/383* | (2006.01) |
| *G01R 33/385* | (2006.01) |

(52) U.S. Cl.
CPC ....... *G01R 33/3806* (2013.01); *G01R 33/383* (2013.01); *G01R 33/385* (2013.01); *G01R 33/3815* (2013.01)

(58) Field of Classification Search
CPC ............ G01R 33/3806; G01R 33/3815; G01R 33/383; G01R 33/385; G01R 33/381; G01R 33/3808
See application file for complete search history.

(56) References Cited

U.S. PATENT DOCUMENTS

| | | | | |
|---|---|---|---|---|
| 4,240,439 A * | 12/1980 | Abe | ................... | G01R 33/3808 600/423 |
| 5,646,532 A | 7/1997 | Knuttel et al. | | |
| 5,708,362 A * | 1/1998 | Frese | ................. | G01R 33/3806 324/319 |
| 5,799,653 A * | 9/1998 | Carlson | ................ | G01R 33/381 335/297 |
| 2008/0039714 A1* | 2/2008 | Jonas | ..................... | A61B 5/055 600/415 |

(Continued)

FOREIGN PATENT DOCUMENTS

| | | |
|---|---|---|
| CA | 3130759 A1 | 8/2020 |
| EP | 4067925 A1 | 10/2022 |
| WO | WO-2020219924 A1 * 10/2020 | ............. A61B 5/055 |

*Primary Examiner* — G. M. A Hyder
(74) *Attorney, Agent, or Firm* — Banner & Witcoff Ltd.

(57) ABSTRACT

A magnetic resonance imaging device having a field generation unit configured to provide a magnetic field in an imaging volume of the magnetic resonance imaging device. The field generation unit has at least one magnet. A surface of the field generation unit directed towards the imaging volume of the at least one magnet has a concave shape, wherein a direction of access to the imaging volume is oriented essentially perpendicular to a main direction of magnetic field lines in the imaging volume.

20 Claims, 9 Drawing Sheets

(56) References Cited

U.S. PATENT DOCUMENTS

| | | |
|---|---|---|
| 2008/0125641 A1 | 5/2008 | Jonas et al. |
| 2015/0038830 A1 | 2/2015 | Blasche et al. |
| 2018/0356480 A1* | 12/2018 | Weinberg ............... A61B 5/702 |
| 2019/0076080 A1 | 3/2019 | Prado |
| 2020/0003856 A1 | 1/2020 | Constable et al. |
| 2020/0305758 A1 | 10/2020 | McDaniel et al. |
| 2020/0309878 A1* | 10/2020 | Popescu ............... G01R 33/383 |
| 2020/0355764 A1 | 11/2020 | Popescu |
| 2021/0156936 A1 | 5/2021 | Popescu |
| 2021/0156938 A1* | 5/2021 | Greiser ................. A61B 5/055 |
| 2021/0341556 A1 | 11/2021 | Mallett et al. |
| 2022/0308142 A1 | 9/2022 | Mallett et al. |

\* cited by examiner

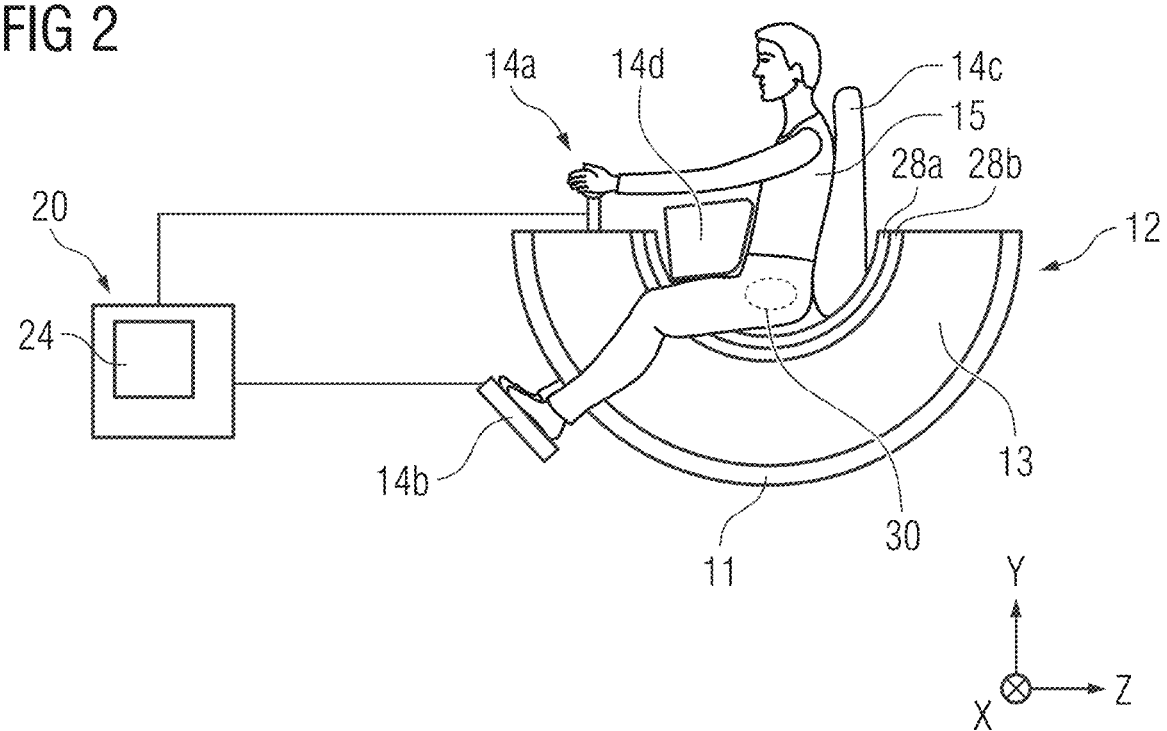
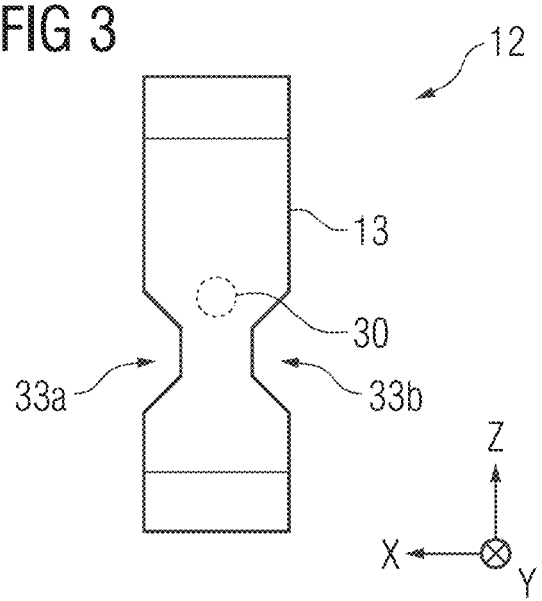

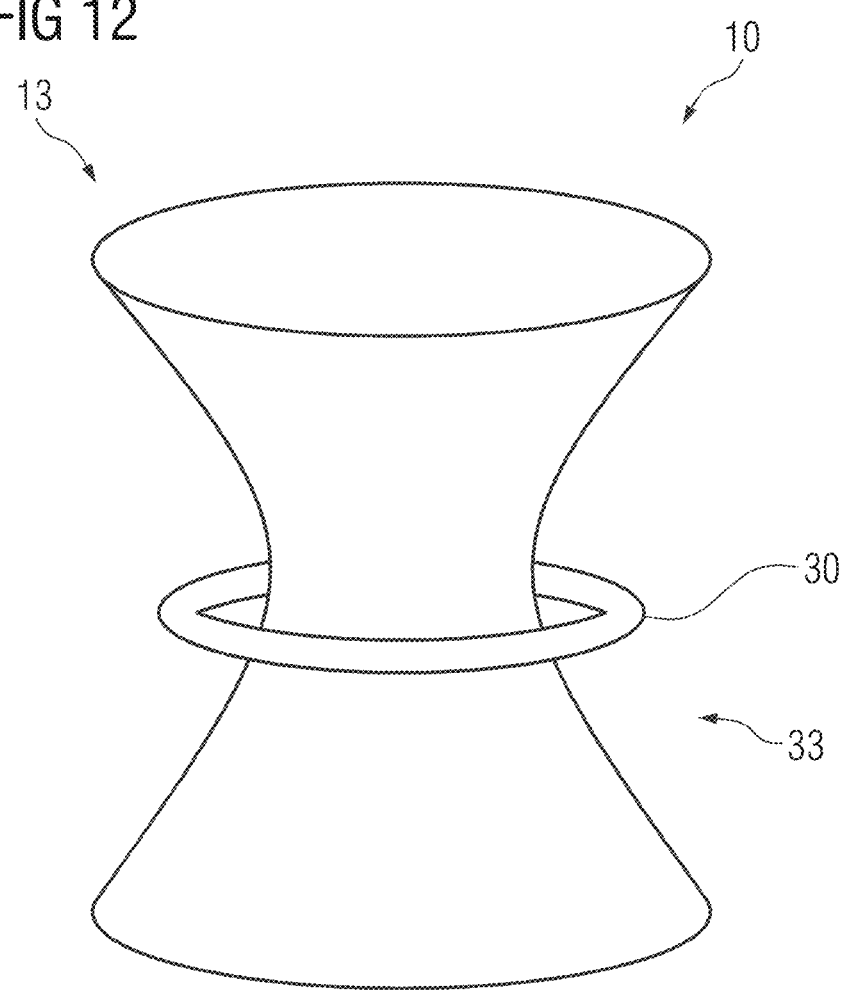

MAGNETIC RESONANCE IMAGING DEVICE WITH A CONCAVE-SHAPED FIELD GENERATION UNIT

FIELD OF THE DISCLOSURE

The disclosure relates to a magnetic resonance imaging device comprising a field generation unit configured to provide a magnetic field in an imaging volume of the magnetic resonance imaging device, wherein the field generation unit comprises at least one magnet and wherein a direction of access to the imaging volume is oriented essentially perpendicular to a main direction of magnetic field lines in the imaging volume.

BACKGROUND

Magnetic resonance tomography represents a prominent imaging method for acquiring images of an interior of an examination object. For carrying out a magnetic resonance measurement, the examination object is usually positioned in a strong and homogeneous static magnetic field (BO field) of a magnetic resonance imaging device. The static magnetic field may comprise magnetic field strengths of 0.2 Tesla to 7 Tesla, thus aligning nuclear spins inside the examination object along the static magnetic field. For triggering so-called nuclear spin resonances, radiofrequency excitation pulses are emitted into the examination subject. Each radiofrequency excitation pulse causes a magnetization of nuclear spins within the examination object to deviate from the static magnetic field by an amount which is known as the flip angle. A radiofrequency excitation pulse may comprise an alternating (electro-)magnetic field with a frequency which corresponds to the Larmor frequency at the respective static magnetic field strength. Excited nuclear spins may exhibit a rotating and decaying magnetization (nuclear magnetic resonance), which can be detected using dedicated radiofrequency antennas. For spatial encoding of measured data, rapidly switched magnetic gradient fields are superimposed on the static magnetic field.

The received nuclear magnetic resonances are typically digitized and stored as complex values in a k-space matrix. This k-space matrix can be used as a basis for a reconstruction of magnetic resonance images and for determining spectroscopic data. A magnetic resonance image is typically reconstructed by means of a multi-dimensional Fourier transformation of the k-space matrix.

During an imaging examination, the patient is typically enclosed in a bore or a pair of magnets of the magnetic resonance imaging device. Due to spatial restrictions within the bore or a space between the pair of magnets, magnetic resonance imaging provides limited use for surgical procedures or biopsies. As the patient needs to be positioned inside the magnetic resonance imaging device, a size of the bore as well as other dimensions of the magnetic resonance imaging device are dictated by the size of the human body. From a cost and/or space utilization perspective, this may be unsatisfactory, especially if the examination is restricted to a body region of the patient, which is significantly smaller than an imaging volume provided by the magnetic resonance imaging device. Furthermore, patients with a claustrophobic condition and children may not tolerate being positioned in a confined imaging space associated with conventional magnetic resonance imaging devise for a prolonged period of time.

SUMMARY

It is therefore an object of the disclosure to provide a magnetic resonance imaging device with enhanced openness and/or accessibility for imaging of dedicated body regions of a patient. This object is achieved by a magnetic resonance imaging device according to the disclosure.

The disclosed magnetic resonance imaging device comprises a field generation unit configured to provide a magnetic field in an imaging volume of the magnetic resonance imaging device, wherein the field generation unit comprises at least one magnet.

A field generation unit may comprise one magnet or a plurality of magnets required for performing a magnetic resonance measurement. For example, the field generation unit may comprise at least one magnet configured to generate a static magnetic field inside an imaging volume of the magnetic resonance imaging device. A static magnetic field may be a main magnetic field and/or a BO-field of the magnetic resonance imaging device. The static magnetic field may comprise either an essentially homogeneous magnet field or a predetermined magnetic gradient field. In a further example, the field generation unit comprises at least one gradient coil for generating a temporary magnetic gradient field inside the imaging volume. It is also conceivable, that the field generation unit includes at least one radiofrequency antenna for emitting radiofrequency excitation pulses in a power and frequency range of a magnetic resonance measurement into an image acquisition region of the magnetic resonance imaging device. The at least one radiofrequency antenna may further be configured to receive magnetic resonance signals (nuclear magnetic resonance) from the image acquisition region. In one aspect, the at least one magnet may be configured as a main magnet for generating a static magnetic field inside the imaging volume. However, the at least one magnet may also correspond to a gradient coil, a set of gradient coils and/or a radiofrequency antenna of the magnetic resonance imaging device.

An imaging volume may be characterized by a predefined magnetic field direction and/or a predefined magnetic field strength. For example, the imaging volume may comprise a volume with a substantially uniform magnetic field direction and/or magnetic field strength. Such a volume may be an isocenter of the magnetic resonance imaging device. It is also conceivable, that the imaging volume comprises a predefined magnetic gradient field. Such a magnetic gradient field may be used for spatial encoding of magnetic resonance signals acquired from an examination object positioned within the imaging volume.

A surface directed towards the imaging volume of the at least one magnet comprises a concave shape.

The surface directed towards the imaging volume of the at least one magnet may be a pole face of the at least one magnet. A pole face may be characterized by a terminating surface of the at least one magnet. It is conceivable, that a magnetic field strength at the pole face of the at least one magnet is particularly high. A pole face may also represent a side of the at least one magnet, which is directed towards or away from the imaging volume. In the case of a permanent magnet, a pole face may be a terminating surface of a north pole and/or a south pole. Particularly, the surface directed towards the imaging volume of the at least one magnet may relate to a surface of a magnetic material of the at least one magnet. In case the at least one magnet comprises resistive wires or superconducting wires, the pole face may relate to a surface of an imaginary membrane, an imaginary envelope or an imaginary envelope curve circumferentially enclosing the magnet.

The surface directed towards the imaging volume of the at least one magnet may be shaped such a way, that a perpendicular distance between a line oriented along a main direction of magnetic field lines within the imaging volume and the surface directed towards the imaging volume of the at least one magnet varies in the main direction of the magnetic field lines. It is conceivable, that the surface directed towards the imaging volume of the at least one magnet is characterized by an arc of a circle or an ellipse. For example, the surface directed towards the imaging volume may comprise the shape of a "U" or a "C". In one aspect, the imaging volume is positioned within a recess or an indentation provided by the concave surface directed towards the imaging volume of the at least one magnet. A cross-section of the recess or indentation may comprise the shape of a parabola, a hyperbola, or a part of an ellipse or a circle. In one aspect, a topology or shape of the at least one magnet may correspond to a saddle. The at least one magnet may be designed to accommodate a pelvic region of a patient sitting upon the surface directed towards the imaging volume of the at least one magnet. According to a further aspect, the at least one magnet may comprise the shape of a curved beam or a hyperboloid. The curved beam may be oriented along a sagittal plane of a patient sitting on the surface directed towards the imaging volume of the at least one magnet. The shapes of a 'U', a 'C' and/or a curved beam may be regarded as saddle-shapes within the meaning of the current disclosure. In one aspect, the surface directed towards the imaging volume of the at least one magnet may comprise a concave shape along an anterior-posterior direction of the patient and a convex shape along a left-right direction of the patient. However, the at least one magnet may also be designed to accommodate other body regions of the patient, such as a facial region, a head region, an extremity, a breast region and the like.

A direction of access to the imaging volume is oriented essentially perpendicular to a main direction of magnetic field lines in the imaging volume.

The direction of access to the imaging volume may be characterized by a substantially straight line leading from an arbitrary point in an environment, particularly an examination room, to a center of the imaging volume. Preferably, a trajectory defined by the line is unobstructed by components of the magnetic resonance imaging device. The direction of access relates to a trajectory along which a patient can enter the imaging volume.

The at least one magnet may confine the imaging volume in at least one spatial direction in such a way, that accessing or entering the imaging volume from a direction substantially corresponding to the at least one spatial direction is impractical or impossible. For example, the at least one magnet may bar or block an access to the imaging volume in any direction oriented in parallel with the main direction of magnetic field lines in the imaging volume. The at least one magnet preferably provides access to the imaging volume along at least two perpendicular spatial directions. The two perpendicular spatial directions may be oriented essentially perpendicular to the main direction of magnetic field lines in the imaging volume. The main direction of magnetic field lines in the imaging volume may be characterized by an average or a mean direction of a plurality of magnetic field vectors within the imaging volume.

In one aspect, the disclosed magnetic resonance imaging device comprises a supporting structure configured for providing structural support to the field generation unit. The supporting structure may comprise a positioning unit configured to adjust a position and/or an orientation of the field generation unit in at least one or at least two spatial directions. Particularly, the positioning unit may be configured to position the field generation unit along one axis or along two perpendicular axes of a cartesian coordinate system. Preferably, the positioning unit is configured to position the field generation unit along three perpendicular axes of a cartesian coordinate system. For example, the positioning unit may comprise a rail system and/or a telescope system configured to transport the field generation unit along predetermined trajectories.

The positioning unit may further comprise a hinge and/or a movable joint configured for adjusting an orientation of the field generation unit. For example, the positioning unit may be configured to adapt a position and/or orientation of the field generation unit relative to a target anatomy of a patient. The patient may rest in a predefined posture, such as a lying position, a sitting position or a standing position, while the field generation unit is positioned and/or oriented relative to the patient. An adjustment of the position and/or orientation of the field generation unit may involve adjusting a position of the imaging volume to cover at least a part of the target anatomy of the patient. The patient may also be placed on a patient positioning device configured for positioning the patient in a desired relative position and/or orientation to the magnetic resonance imaging device. In providing a positioning unit, the position of the imaging volume of the magnetic resonance imaging device may favorably be adapted to a cover a target anatomy of an immobile or disabled patient.

In a further aspect, the disclosed magnetic resonance imaging device may comprise a stray field containment unit configured to align a magnetic stray field of the field generation unit in such a way, that a magnetic field strength and/or a magnetic field homogeneity in a center of the imaging volume is increased.

In one aspect, the stray field containment unit comprises a backing plate attached to the at least one magnet, wherein the backing plate comprises a ferromagnetic material and wherein the backing plate is attached to a surface directed away from the imaging volume of the at least one magnet. Preferably, the backing plate fully encloses or covers the surface directed away from the imaging volume of the at least one magnet. In a further aspect, the stray field containment unit comprises a yoke attached to the at least one magnet, wherein the yoke comprises a ferromagnetic material. Examples for ferromagnetic materials are iron, cobalt, nickel, but also lanthanoids, gadolinium and the like. Ferromagnetic materials may be deployed as a solid material or as a fluid. In an aspect, the backing plate and/or the yoke are made of iron, an iron alloy or any other material with a high magnetic permeability.

The yoke may represent a at least a part of the supporting structure. Thus, the yoke may provide structural support to the field generation unit and/or maintain a predefined shape of the at least one magnet. Particularly, the yoke may be configured to counteract attractive magnetic forces of sections of the at least one magnet. It is conceivable, that the yoke is attached to the surface directed away from the imaging volume of the at least one magnet. The yoke and/or the backing plate may comprise a concave shape to match a concave surface directed away from the imaging volume of the at least one magnet. In an aspect, the backing plate and/or the yoke act as a supporting structure according to an aspect described above. Particularly, the supporting structure, the backing plate and/or the yoke may be designed to enhance, restrict or shape a magnetic field of the disclosed magnetic resonance imaging device. In providing a stray field containment unit according to an aspect described above, an alignment of the magnetic stray field can advantageously be achieved without limiting or compromising the accessibility of the imaging volume. As a further advantage, characteristics of the magnetic field within the imaging volume may favorably be improved.

In a further aspect, the stray field unit further comprises a shield coil configured to align the magnetic stray field of the field generation unit in such a way, that a magnetic field strength and/or a magnetic field homogeneity in a center of the imaging volume is increased. The shield coil favorably comprises one or more coils are wires, which are arranged in a curved plane corresponding to the concave shape of the surface directed towards the imaging volume of the at least one magnet. In an aspect, the shield coil is positioned adjacent to the surface directed towards the imaging volume of the at least one magnet.

In providing at least one magnet with a concave surface directed towards the imaging volume, an openness of the field generation unit may favorably be enhanced in comparison to conventional magnetic resonance imaging devices. Thus, an access to the imaging volume may be facilitated, while still providing a sufficient coverage of a diagnostically relevant body region of a patient with magnetic material. Particularly, the disclosed magnetic resonance device may provide an easy and/or optimized access of a specific body region of a patient to the imaging volume with limited compromises regarding image quality and/or image acquisition time. Further advantages of the disclosed magnetic resonance imaging device may be constituted by a cost and/or weight reduction in comparison to conventional magnetic resonance imaging devices.

According to one aspect of the disclosed magnetic resonance imaging device, the at least one magnet is designed to provide access to the imaging volume along at least two perpendicular spatial directions, wherein each of the two perpendicular spatial directions is oriented essentially perpendicular to the main direction of magnetic field lines in the imaging volume.

For example, the imaging volume may be at least partially embedded within the recess or indentation provided via the concave surface directed towards the imaging volume of the at least one magnet. In an aspect, the at least one magnet comprises the shape of a curved beam, at least partially enclosing the imaging volume along a trajectory defined by the concave surface directed towards the imaging volume. The curved beam may comprise an arched outline or contour, at least partially enclosing the imaging volume. Preferably, the at least one magnet substantially encloses the imaging along an arc of a cross-section of an imaginary sphere with a center and a volume corresponding to a center and a volume of the imaging volume. Thus, the imaging volume may favorably be accessible from at least two directions oriented perpendicular to the main direction of magnetic field lines within the imaging volume. In an alternative aspect, the surface directed towards the imaging volume of the at least one magnet may also comprise a more three-dimensional shape, such as an inner surface of a cone or a hemisphere. Thus, the at least one magnet may enclose a larger part of the surface of the imaging volume. It is conceivable, that a maximum of 75%, 60%, 45% or 30% of an outer surface of the imaging volume is enclosed by the at least one magnet.

In providing access to the imaging volume along at least two perpendicular spatial directions, multiple ways of entering the imaging volume may be offered to a patient. Thus, a maximum number of body regions of a patient, which may be imaged via the disclosed magnetic resonance imaging device, may favorably be increased. In offering multiple ways and/or directions of accessing the imaging volume, different groups of patients, such as children, elderly and/or disabled people, may favorably enter the imaging volume in a most comfortable manner.

In a further aspect of the disclosed magnetic resonance imaging device, a shape of the imaging volume is adapted to a shape of a target anatomy of a patient.

The at least one magnet may be shaped in such a way, that the imaging volume is non-spherical. Preferably, the at least one magnet is shaped in such a way, that the shape of the imaging volume corresponds to the shape of a target anatomy of a patient. A target anatomy may comprise, for example, a jaw region, a jaw, an eye region, an eye, a part of a spine, a prostate, a heart, a brain or other organs or anatomies. Particularly, the at least one magnet may be shaped in such a way, that the imaging volume provided via the at least one magnet may take into account a variance in anatomical sizes, shapes and/or orientations of the target anatomy. For example, the at least one magnet may be adapted to key variance parameters of a target anatomy. Thus, the shape of the imaging volume provided via the at least one magnet may differ from an actual shape of a target anatomy, but fully cover the target anatomy, when the patient is positioned correctly relative to the disclosed magnetic resonance imaging device. It is also conceivable, that the imaging volume provided via the at least one magnet reduces a volume of any tissue different from tissue of the target anatomy. Thus, a time required for performing a magnetic resonance measurement of the target anatomy with the disclosed magnetic resonance imaging device may favorably be reduced. In one aspect, the imaging volume comprises the shape of a disk, a star, an ellipsoid, an ovoid, a polyhedron or any combination of those shapes.

In providing an imaging volume which is adapted to match the shape of a target anatomy, a process of preparing a magnetic resonance measurement may favorably be facilitated and/or abbreviated. Additionally, in providing a field generation unit adapted to accommodate the target anatomy in a predefined relative position, an efficiency of preparing and/or performing a magnetic resonance measurement may favorably be increased.

In a further aspect of the disclosed magnetic resonance imaging device, the at least one magnet is designed to accommodate a patient in a sitting position on the surface directed towards the imaging volume, wherein the at least one magnet comprises at least one recess configured for accommodating a leg of the patient positioned in the sitting position.

In an aspect, the disclosed magnetic resonance imaging device is a dedicated prostate scanner configured to acquire magnetic resonance signals from a prostate region of a patient. For this purpose, the patient may be seated upon the surface directed towards the imaging volume of the at least one magnet. One leg of the patient may border the at least one magnet from a first side and a second leg of the patient may border the at least one magnet from a second side different from the first side. Preferably, the first side and the second side are directed away from the imaging volume. The first side and the second side may be oriented in substantially opposing spatial directions. It is conceivable, that the first side of the at least one magnet comprises a first recess configured to accommodate the one leg. The second side of the at least one magnet may comprise a second recess configured to accommodate the second leg of the patient. A shape of the first recess and the second recess may essentially correspond to a shape and/or a contour of a leg of the patient. Preferably, the first recess and/or the second recess of the at least one magnet are designed in such a way, that an angle and/or a distance between a thigh of the one leg and a thigh of the second leg of the patient seated upon the surface directed towards the imaging volume of the at least one magnet is reduced in comparison to an aspect without recess. Of course, the first recess and the second recess may be designed as indentations in the at least one magnet. A sitting position of the patient may correspond to a correct posture of the patient for performing a magnetic resonance imaging measurement of the prostate.

In providing a recess or indentation for accommodating a leg of the patient, a strain associated with spreading legs of the patient may favorably be reduced or eliminated when the patient is seated upon the disclosed magnetic resonance imaging device for performing a magnetic resonance measurement.

According to one aspect, the disclosed magnetic resonance imaging device further comprises a positioning aid configured to support a patient in maintaining a correct posture for performing a magnetic resonance imaging measurement.

A positioning aid may be configured to support a specific body region of the patient. For example, the positioning aid may be configured as a footrest, a backrest, a headrest, an armrest, a handlebar, a cushion and the like. According to one aspect, the positioning aid encloses at least a part of a contour of a body region of the patient. Thus, the patient may be supported in a three-dimensional manner. The positioning aid may provide passive support, helping the patient to adopt and/or maintain the correct posture. However, the positioning aid may also comprise an adjustment unit configured to actively adjust a position and/or orientation of the positioning aid relative to the at least one magnet. The adjustment unit may allow for manual adjustment of the positioning aid via an operator of the disclosed magnetic resonance imaging device and/or a patient. However, the adjustment unit may also comprise a drive suitable for automatically adapting the position and/or orientation of the positioning aid. It is conceivable, that the adjustment unit can be remotely controlled via an operator of the disclosed magnetic resonance imaging device. Thus, a specific body region or a plurality of specific body regions of the patient may be guided, positioned and/or supported by controlling the position and/or orientation of the positioning aid. Preferably, the positioning aid supports the specific body region or plurality of specific body regions of the patient in such a way, that the patient adopts the correct posture.

The correct posture is characterized by a predefined relative position between the patient and the magnetic resonance imaging device, wherein at least a part of a diagnostically relevant body region of the patient is covered by the imaging volume, when the patient is positioned in the correct posture.

For example, the prostate, the jaw region, the eye region, the brain or other target anatomies of the patient may be positioned within the imaging volume when the patient is positioned in the correct posture. The positioning aid may support the patient in such a way, that a relative position of the target anatomy and the disclosed magnetic resonance imaging device is maintained throughout a magnetic resonance measurement of the target anatomy. However, the positioning aid may also be configured to match a position of the target anatomy with a position of the imaging volume during a preparation of a magnetic resonance measurement. It is also conceivable, that the positioning aid comprises an adjustment unit enabling the patient and/or an operator to match the position of the target anatomy with the position of the imaging volume.

The disclosed magnetic resonance imaging device may provide a significantly increased openness in comparison to conventional magnetic resonance imaging devices, thus increasing a risk of a patient to move during a magnetic resonance measurement. In providing a positioning aid, a movement of the patient during a magnetic resonance measurement may favorably be restricted, thus increasing an imaging quality of the disclosed magnetic resonance imaging device. Furthermore, a process of matching a position of a target anatomy and the imaging volume of the disclosed magnetic resonance imaging device may favorably be facilitated and/or accelerated via the positioning aid.

In an aspect, the positioning aid comprises an adjustment unit and a processing unit, wherein the adjustment unit is configured to adjust a position and/or an orientation of the positioning aid relative to the at least one magnet and wherein the processing unit is configured to receive patient information and control the adjustment unit to adapt the position and/or orientation of the positioning aid in dependence of the patient information.

A processing unit may be a main processing unit of the disclosed magnetic resonance imaging device configured for processing magnetic resonance image data and/or reconstructing magnetic resonance images acquired during a magnetic resonance measurement. However, the processing unit may also be separate from the main processing unit and/or comprise a signal connection enabling communication with the main processing unit. The processing unit may be integrated within a control unit of the magnetic resonance imaging device according to the disclosure.

As described above, the adjustment unit may comprise a drive configured for adapting the position and/or orientation of the positioning aid. Preferably, the processing unit may be configured to acquire patient information from a source and automatically adapt the orientation and/or position of the positioning aid in dependence of the acquired patient information by controlling the adjustment unit. A source may be a user interface, a radiological information system, a hospital information system, an internal or external storage unit, an electronic patient registration and the like. Patient information may comprise any information on a patient relevant for performing a magnetic resonance measurement. For example, patient information may comprise information on an age, a weight, a body size, a gender, a medical history, a course of treatment, a target anatomy as well as other information on the patient.

In providing an adjustment unit and a processing unit configured to automatically adjust the position and/or orientation of the positioning aid in dependence of patient information, patients may favorably be positioned in the correct posture in a reproducible and/or robust manner. Furthermore, a time required for positioning the patient in the correct posture may favorably be reduced.

According to a further aspect of the disclosed magnetic resonance imaging device, the surface directed towards the imaging volume of the at least one magnet is shaped to match a contour of a body region of a patient, wherein the body region of the patient comprises at least one of:
 a spinal region,
 a facial region,
 a pelvic region,
 a breast region,
 an abdominal region,
 an extremity of the patient.

A contour of a body region of the patient may be at least a segment of a circumference of an axial cross-section of the body or a body part of the patient. For example, a contour of the body region of the patient may be characterized by a segment of an outline of an axial cross-section of the breast region, the facial region, the abdominal region or an extremity (e.g., a thigh or an arm) of the patient. The surface directed towards the imaging volume of the at least one magnet may correspond to an outline of the contour of a body region of the patient. Preferably, the at least one magnet is shaped like a saddle, matching a contour of the pelvic region of the patient seated in the correct posture upon the at least one magnet. However, the at least one magnet may also comprise a 'U'-shape or a 'C'-shape configured to match a contour of the facial region and/or of other body regions of the patient.

By matching a shape of the surface directed towards the imaging volume of the at least one magnet with the contour of a body region of the patient, a distance between the at least one magnet and a surface of the body of the patient can favorably be reduced when positioning the patient in the correct posture. Thus, costs and/or spatial requirements associated with providing a magnetic field and/or a magnetic gradient field configured to operate at higher distances to the patient can advantageously be reduced.

According to one aspect of the disclosed magnetic resonance imaging device, the surface directed towards the imaging volume of the at least one magnet is shaped to match the contour of the pelvic region of the patient and designed to accommodate the patient in a sitting position, wherein at least a part of a prostate and/or a lymph node in proximity to the prostate of the patient is positioned within the imaging volume, when the patient is positioned in the sitting posture.

As described above, the at least one magnet may be shaped like a saddle matching a contour of the pelvic region of the patient seated in the correct posture upon the at least one magnet. The concave surface directed towards the imaging volume of the at least one magnet may be shaped in such a way, that the pelvic region of the patient seated upon the at least one magnet automatically slides into a lowest region of the at least one magnet, thus positioning at least a part of the prostate within the imaging volume. The lowest region may be characterized by a nook and/or a lowest section of the concave surface directed towards the imaging volume of the at least one magnet with respect to a floor of an examination room. For example, the nook may be characterized by a minimal perpendicular distance between the surface directed towards the imaging volume of the at least one magnet and an essentially planar surface of a floor of the examination room. It is also conceivable, that the at least one recess configured for accommodating a leg of the patient supports the patient in adopting and/or maintaining a correct posture for performing a magnetic resonance measurement of the prostate and/or a lymph node of the patient. In an aspect, the patient may adopt the correct posture when taking place upon the surface directed towards the imaging volume of the at least one magnet in a sitting position. For this purpose, the patient may be supported by a positioning aid according to an aspect described above.

In providing a saddle-shaped magnet, a patient may favorably be supported in adopting and/or maintaining the correct posture for a magnetic resonance measurement. Furthermore, a saddle-shaped magnet designed for accommodating the patient in a sitting position may favorably facilitate access to the imaging volume, particularly for elderly or disabled people, and/or enable children to keep eye contact with their parents during a magnetic resonance measurement.

According to one aspect of the disclosed magnetic resonance imaging device, the field generation unit further comprises an adjustment mechanism configured to adjust a position and/or orientation of at least a part of the field generation unit and modify a property of the magnetic field provided via the field generation unit, wherein the property of the magnetic field comprises at least one of a shape of the imaging volume, a position of the imaging volume, a magnetic field strength and/or a direction of magnetic field lines.

In an aspect, the adjustment mechanism may constitute a part of a supporting structure attached to the field generation unit. The supporting structure may be configured according to an aspect described above. For example, the adjustment mechanism may constitute a part of the positioning unit. The positioning unit may be configured to modify a position and/or an orientation of the field generation unit, thus changing a position and/or orientation of the imaging volume. However, the adjustment mechanism may also be configured to modify a geometric arrangement of the field generation unit or parts of the field generation unit, such as a magnet, a radiofrequency antenna, a gradient coil, a shield coil, but also a yoke, a backing plate and the like. Particularly, the adjustment mechanism may be configured to adjust a position and/or orientation of a magnet configured for providing and/or modifying a static magnetic field within the imaging volume. The term imaging volume shall be construed as a volume with approximately homogenous magnetic field properties and not a sampling volume of a radiofrequency antenna.

According to one aspect, the adjustment mechanism comprises or mechanically connects to a magnet, such as a permanent magnet, an electromagnet and/or a superconducting magnet configured to provide a secondary magnetic field. The secondary magnetic field may modify a property of the magnetic field when a relative position between the field generation unit and the magnet is changed and/or a current is fed through the magnet. The magnet may be positioned relative to other parts of the field generation unit to modify a property of the magnetic field, such as a magnetic field strength, a direction of magnetic field lines and/or a shape of the imaging volume. For this purpose, the adjustment mechanism may comprise gears and/or machinery suitable for adjusting the position and/or orientation of at least a part of the field generation unit. The adjustment mechanism may be adjusted manually and/or automatically. For example, the adjustment mechanism may be adjusted by a drive controlled via a processing unit of the magnetic resonance imaging device. However, the adjustment mechanism may also allow for a manual adjustment of the adjustment mechanism, e.g., via a handle or lever.

In an aspect, the adjustment mechanism comprises an electromagnet including at least one resistive coil or a superconducting magnet including at least one superconducting coil configured to generate a magnetic field when a current is fed through the at least one resistive coil or the at least one superconducting coil. In one example, the property of the magnetic field may be modified by adjusting a position of the electromagnet or superconducting magnet relative to other parts of the field generation unit. However, the property of the magnetic field may also be modified by feeding a current through the electromagnet or superconducting magnet.

The relative position between the electromagnet or superconducting magnet and other parts of the field generation unit may favorably be adjusted without having to overcome attractive magnetic forces, when no current is applied to the electromagnet or superconducting magnet. In providing an adjustment mechanism, a property of the magnetic field provided via the field generation unit may favorably be modified to match a position and/or shape of a target anatomy of a patient.

In one aspect of the disclosed magnetic resonance imaging device, the at least one magnet comprises at least one of:
a permanent magnet,
an array of permanent magnets,
a resistive coil,
an array of resistive coils,
a high temperature superconductor
a low temperature superconductor and
wherein the surface directed towards the imaging volume of the at least one magnet corresponds to a pole face of the at least one magnet and/or a surface of a material of the at least one magnet configured to provide a magnetic field.

A permanent magnet may consist of a magnetic material, such as AlNiCo (aluminum-nickel-cobalt), NeFeB (neodymium-iron-boron) or SmCo (samarium-cobalt) alloys. The permanent magnet may comprise any desired shape. In one aspect, the permanent magnet comprises a bar shape. A bar shape may include a cuboid bar shape, a cylindrical bar shape or a bar shape with a polygonal cross-section, such as a prism. The bar-shaped permanent magnet may be bent or curved in such a way to provide a concave surface directed towards the imaging volume. Bar-shaped permanent magnets provide a low-cost solution for generating a magnetic field within the imaging volume. In another aspect, the permanent magnet may be composed of smaller, stacked permanent magnets or an array of permanent magnets. The array of permanent magnets may comprise a plurality of magnets with variable magnetic field strength and/or magnetic orientation. Particularly, the array of permanent magnets may be configured as a Halbach array. The use of a permanent magnet may favorably avoid costs and space required for cooling equipment usually associated with superconducting magnets and electromagnets.

The at least one magnet may also be an electromagnet. An electromagnet may be a non-superconducting magnet. Particularly, an electromagnet may comprise a resistive coil (e.g., an electrical conductor) wound around a magnetic core made of, for example, a ferromagnetic or ferrimagnetic material. An axial cross-section of the magnetic core may comprise a cylindrical shape, a cuboid shape, a prism shape or any other desirable shape. However, a magnetic core may also be omitted. The resistive coil may be wound in such a way to provide a concave surface directed towards the imaging volume. For this purpose, the resistive coil may be wound in a curved plane corresponding in shape to the concave surface directed towards the imaging volume of the at least one magnet. However, the resistive coil may also comprise a winding pattern, which permeates a three-dimensional volume of the at least one magnet. In a further aspect, the electromagnet comprises an array of resistive coils. It is also conceivable, that the array of resistive coils is configured as a Halbach array. By using an electromagnet, the magnetic field strength can be favorably increased in comparison to a permanent magnet of comparable size. Higher magnetic field strengths can advantageously enhance a quality and/or a signal-to-noise ratio of a magnetic resonance image acquired via the disclosed magnetic resonance imaging device.

A superconductor may comprise coils of superconducting wire and/or magnet segments of superconducting material. The superconductor may be a high temperature superconductor or a low temperature superconductor connected to a cryostat to keep a temperature of the superconductor below a predefined value. Analogous to resistive wires, the coils of superconducting wire may be arranged in such a way to provide a concave surface directed towards the imaging volume. The superconducting wire may be embedded in an electrical conductor, such as copper, gold, silver and the like. However, the superconductor may also comprise one or more bulk magnet segments made from a superconducting material. Preferably, the magnet segments constitute a concave surface directed towards the imaging volume.

A low temperature superconductor may comprise superconducting properties at a temperature of about 4 K, whereas high temperature superconductors may comprise superconducting properties at temperatures in the range of 30 to 90 K. Examples of high temperature superconductors are barium copper oxides (e.g. YBCO, ReBCO), calcium copper oxides (e.g. BSCCO) as well as doped fullerides (e.g. $Cs_2RbC_{60}$), magnesium diboride and the like. Examples for low temperature superconducting materials are niobium-titanium alloys, niobium-tin alloys as well as magnesium diborides. In using high temperature superconductors, an efficiency of a cryostat configured for cooling of the at least one magnet may favorably be increased in comparison to low temperature superconductors. In contrast, low temperature superconductors may be less expensive and easier to handle. By using a superconducting magnet, the magnetic field strength can favorably be increased in comparison to a permanent magnet or an electromagnet of comparable size.

Particularly, in case of an electromagnet or a superconducting magnet, the surface directed towards the imaging volume of the at least one magnet may correspond may be characterized by a surface of a virtual envelope or a virtual envelope curve circumferentially enclosing the resistive coils or superconducting wires. Thus the term surface directed towards the imaging volume of the at least one magnet may refer to a surface of a virtual envelope enclosing the electromagnet or superconducting magnet.

According to a further aspect of the disclosed magnetic resonance imaging device, the surface directed towards the imaging volume of the at least one magnet comprises a hole, wherein the hole is configured to provide an access to the imaging volume from a side of the at least one magnet, which is directed away from the imaging volume.

The hole may be designed in such a way to provide an unobstructed view through the disclosed magnetic resonance imaging device, enhance airflow to the imaging volume and/or provide access to the imaging volume for intervention and/or therapy instruments. For example, the hole may provide clearance for positioning a rectal coil when the patient is placed in the correct position upon the surface directed towards the imaging volume of the at least one magnet. However, the hole may also provide clearance for poisoning an intraoral coil when a facial region of the patient is positioned inside the imaging volume. Of course, other medical instruments associated with intervention and/or therapy may be guided through the hole of the at least one magnet. In case the at least one magnet comprises an electromagnet or a superconductor, resistive coils or superconducting wire may be routed around the hole of the at least one magnet. In one example, the hole may comprise the shape of a cylinder. However, the hole may also comprise a conical shape and/or a tapering shape. An axial cross-section of the hole may be circular, oval or polygonal in shape.

In providing a hole according to an aspect described above, medical instruments and/or equipment may favorably be introduced from a backside of the at least one magnet.

Thus, a chance of success of an intervention or therapy accompanied by magnetic resonance measurement as well as an image quality of the magnetic resonance imaging device may favorably be enhanced. Furthermore, the hole may provide an unobstructed view through the at least one magnet during a magnetic resonance measurement of the facial region and/or the head of the patient. Thus, the patient may be enabled to maintain eye contact with other persons in the examination room, possibly reducing a risk of aborting a magnetic resonance measurement due to discomfort.

In one aspect of the disclosed magnetic resonance imaging device, the field generation unit comprises a gradient field system including at least one gradient coil which is configured to provide a magnetic gradient field within the imaging volume.

The gradient field system may comprise at least one gradient coil, at least two gradient coils or at least three gradient coils. Preferably, the at least one gradient coil is configured to generate a magnetic gradient field within the imaging volume. The magnetic gradient field may be used for spatial encoding of magnetic resonance signals acquired during a magnetic resonance measurement. The at least one magnetic gradient coil may also comprise a subset of gradient coils configured to provide a magnetic gradient field within the imaging volume. In an aspect, the magnetic gradient field is oriented essentially perpendicular to a main direction of magnetic field lines within the imaging volume.

A surface directed towards the imaging volume of the at least one gradient coil comprises a concave shape.

Preferably, the at least one gradient coil is positioned between the concave surface directed towards the imaging volume of the at least one magnet and the imaging volume. A shape of the at least one gradient coil may be matched with the concave surface directed towards the imaging volume of the at least one magnet.

The at least one gradient coil is positioned adjacent to the surface directed towards the imaging volume of the at least one magnet.

It is conceivable, that the patient is seated upon the at least one gradient coil when adopting the correct posture for performing a magnetic resonance measurement. However, the disclosed magnetic resonance imaging device may further comprise a radiofrequency antenna and/or a cushion positioned between the at least one gradient coil and the imaging volume. Preferably, the at least one gradient coil, the radiofrequency antenna and/or the cushion comprise a concave surface directed towards the imaging volume to facilitate positioning of the patient in the correct posture.

In one aspect, the gradient field system includes a second gradient coil, wherein a surface directed towards the imaging volume of the second gradient coil comprises a concave shape and wherein the second gradient coil is positioned adjacent to the surface directed towards the imaging volume of the at least one magnet and/or the surface directed towards the imaging volume of the at least one gradient coil.

The second gradient coil may be configured to generate a magnetic gradient field which is oriented essentially perpendicular to the main direction of magnetic fields lines in the imaging volume. It is also conceivable, that the field generation unit of the disclosed magnetic resonance imaging device comprises a third gradient coil. A surface directed towards the imaging volume of the third gradient coil may comprise a concave shape. Preferably, the third gradient coil is positioned adjacent to the surface directed towards the imaging volume of the at least one magnet and/or the surface directed towards the imaging volume of the second gradient coil.

In providing a gradient coil with a concave surface directed towards the imaging volume positioned adjacent to the at least one magnet, a space efficiency of the field generation may favorably be increased.

According to an alternative aspect of the disclosed magnetic resonance imaging device, the field generation unit comprises a gradient field system including at least one gradient coil, wherein the at least one gradient coil is recessed into the surface directed towards the imaging volume of the at least one magnet and wherein the at least one gradient coil is configured to provide a magnetic gradient field within the imaging volume.

In one aspect, the at least one gradient coil may be recessed into the surface directed towards the imaging volume of the at least one magnet in such a way, that a surface directed towards the imaging volume of the at least one magnet is level with a surface directed to the imaging volume of the at least one gradient coil. Preferably, the surface directed towards the imaging volume of the at least one gradient coil comprises a concave shape that matches the concave shape of the surface directed towards the imaging volume of the at least one magnet. The at least one gradient coil may be at least partially embedded within the at least one magnet. However, it is also conceivable, that the at least one gradient coil is positioned within a hole according to an aspect of the disclosed magnetic resonance imaging system described above.

According to an aspect described above, the surface directed towards the imaging volume of the at least one magnet may correspond to a pole face of the at least one magnet and/or a surface of a material of the at least one magnet configured to provide a magnetic field.

In recessing the at least one gradient coil into the surface directed towards the imaging volume of the at least one magnet, a clearance for the patient accessing the imaging volume may favorably be increased.

In one aspect of the disclosed magnetic resonance imaging device, the at least one gradient coil comprises at least one recess configured for accommodating a leg of the patient.

Analogous to an aspect described above, the at least one gradient coil may comprise at least one recess for accommodating a leg of a patient. It is conceivable, that the at least one recess of the gradient coil and the at least one recess of the at least one magnet provide at least one common recess configured to accommodate one leg of the patient. For this purpose, a position of the at least one recess of the at least one gradient coil may coincide with a position of the at least one recess of the at least one magnet in such a way, that the patient may fit one leg into the at least one common recess provided via the at least one gradient coil and the at least one magnet. In an aspect, the at least one gradient coil comprises a second recess. A position of the second recess of the at least one gradient coil may coincide with a position of the second recess of the at least one magnet in such a way, that the patient may fit a second leg into a second common recess provided via the at least one gradient coil and the at least one magnet. A wire or a plurality of wires of the at least one gradient coil may be wound in such a way, that the wire or the plurality of wires circumvent the at least one recess and/or the second recess.

In providing at least one gradient coil comprising a recess for accommodating a leg of a patient, a possible discomfort of the patient seated upon the surface directed towards the imaging volume of the at least one gradient coil may favorably be reduced or eliminated. Furthermore, a positioning of the patient in the correct posture required for a magnetic resonance measurement may favorably be facilitated by providing a recess for positioning of a leg as a reference.

According to a further aspect of the disclosed magnetic resonance imaging device, the field generation unit comprises a hole passing through the at least one gradient coil and the at least one magnet, wherein the hole is designed to provide an access to the imaging volume from a side of the at least one magnet directed away from the imaging volume.

The at least one gradient coil may be positioned adjacent to or be recessed into the surface directed towards the imaging volume of the at least one magnet. The hole may pass through the at least one gradient coil and the at least one magnet in such a way, that the imaging volume can be accessed from the surface directed away from the imaging volume of the at least one magnet. A shape of an axial cross-section of the hole may be oval or polygonal. The hole passing through the at least one magnet and the at least one gradient coil unit may be configured according to an aspect of the hole passing through the at least one magnet as described above.

In providing a hole passing through the at least one magnet and the at least one gradient coil, a patient positioned in the correct posture may favorably keep eye contact with other persons in the examination room, while facing the surface directed towards the imaging volume of the field generation unit. As a further advantage, accessing the imaging volume with intervention or therapy instruments may be facilitated significantly.

In a further aspect of the disclosed magnetic resonance imaging device, the at least one magnet comprises the shape of a hyperboloid, wherein the at least one magnet is configured to provide a toroidal imaging volume circumferentially enclosing the at least one magnet along at least a section of the at least one magnet.

The at least one magnet may comprise a hyperboloid shape. Preferably, the at least one magnet is rotationally symmetric. The shape of the at least one magnet may correspond to the shape of an hourglass. However, the shape of the at least one magnet may also be characterized by two cones, which are connected at their tips. In one aspect, the at least one magnet may comprise a shape of a part or a segment of a hyperboloid. A constriction area or a tapered area of the hyperboloid may constitute the at least one recess according to an aspect described above, which is configured to accommodate at least one leg of the patient. It is conceivable, that the imaging volume provided via the at least one magnet is shaped like a torus circumferentially enclosing at least a section of the at least one magnet. In one aspect, the imaging volume may circumferentially enclose the at least one magnet along at least a section of an axis of rotational symmetry of the at least one magnet. In an aspect, a position and/or shape of the toroidal imaging volume may be adapted to match a target anatomy, particularly a prostate or a lymph node, of a patient seated on the concave surface directed towards the imaging volume of the at least one magnet. Of course, the at least one magnet may be implemented according to an aspect described above.

In providing a hyperboloid shape, a manufacturing process of the at least one magnet may favorably be facilitated. Thus, manufacturing costs of the at least one magnet may advantageously be decreased. Furthermore, an efficiency of the at least one magnet may be increased in comparison to a unilateral design of the at least one magnet. Due to the hyperboloid shape of the at least one magnet, the imaging volume may favorably be adapted to match a position of a prostate or a lymph node of a patient seated on the concave surface of the at least one magnet.

BRIEF DESCRIPTION OF THE DRAWINGS

Further advantages and details of the present disclosure may be recognized from the aspects described below as well as the drawings. The figures show.

DETAILED DESCRIPTION

Figure 1:
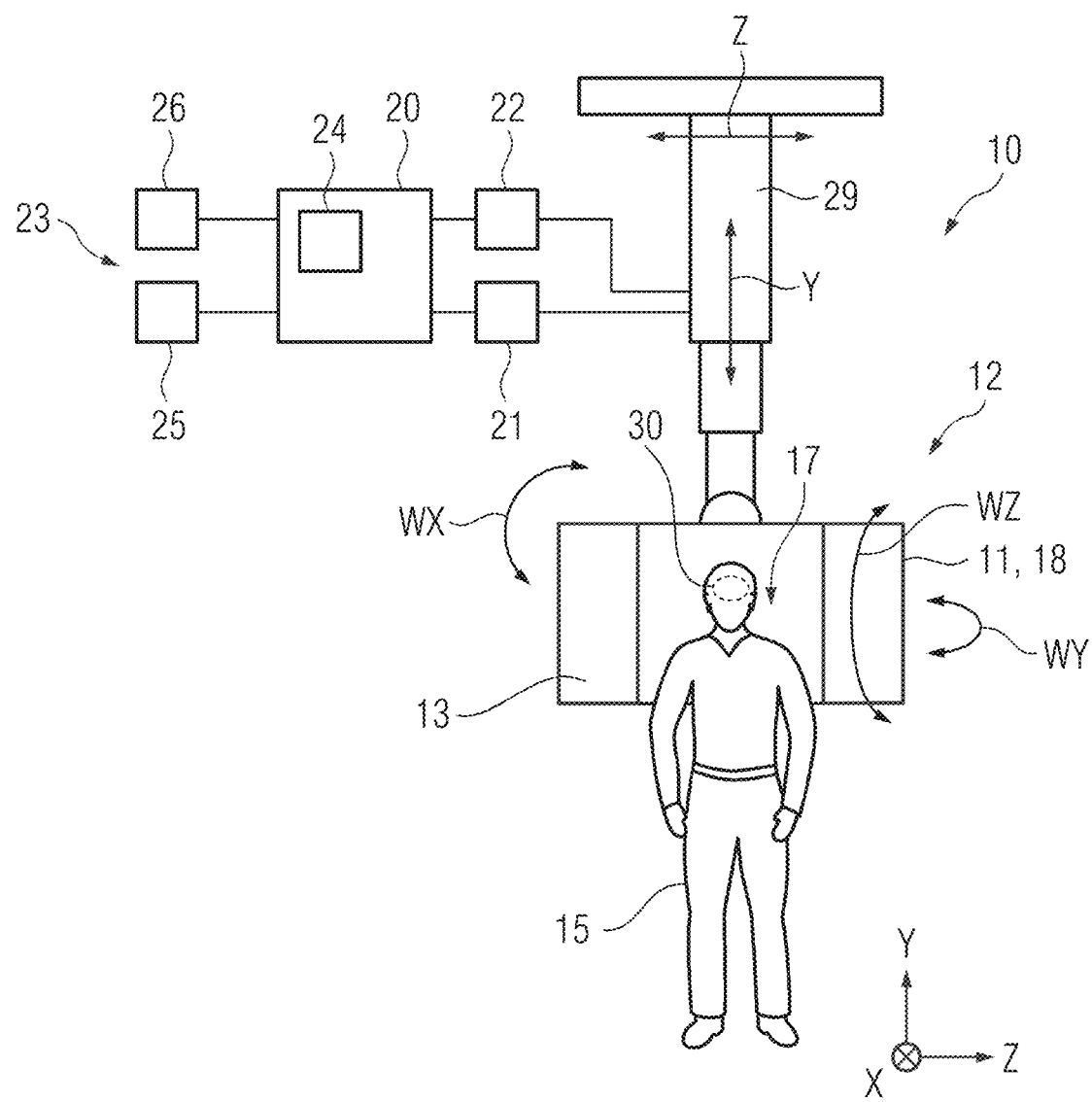
FIG. 1 a schematic representation of an aspect of an disclosed magnetic resonance imaging device, FIG. 2 a schematic representation of an aspect of an disclosed magnetic resonance imaging device, FIG. 3 a schematic representation of an aspect of an disclosed magnetic resonance imaging device, FIG. 4 a schematic representation of an aspect of an disclosed magnetic resonance imaging device, FIG. 5 a schematic representation of an aspect of an disclosed magnetic resonance imaging device, FIG. 6 a schematic representation of an aspect of an disclosed magnetic resonance imaging device, FIG. 7 a schematic representation of an aspect of an disclosed magnetic resonance imaging device, FIG. 8 a schematic representation of an aspect of a magnet of an disclosed magnetic resonance imaging device, FIG. 9 an aspect of a magnet of an disclosed magnetic resonance imaging device, FIG. 10 a schematic representation of an aspect of a gradient coil of an disclosed magnetic resonance imaging device, FIG. 11 a schematic representation of an aspect of a gradient coil of an disclosed magnetic resonance imaging device, and FIG. 12 a schematic representation of an aspect of an disclosed magnetic resonance imaging device.

FIG. 1 depicts a schematic representation of an disclosed magnetic resonance imaging device 10 configured to perform a magnetic resonance measurement of a jaw region and/or an eye region of a patient 15. An application of the magnetic resonance imaging device 10 for imaging of the jaw region and/or the eye region of the patient 15 is to be understood as an example. The disclosed magnetic resonance imaging device 10 may also be configured to perform cardiac imaging, mammography imaging, neurological imaging, urological imaging, orthopedics imaging, prostate imaging or imaging of other body regions of a patient 15. The disclosed magnetic resonance imaging device 10 may also be configured to perform imaging of body regions of an animal.

In the depicted aspect, the magnetic resonance imaging device 10 comprises a field generation unit 12 with a magnet 13. The magnet 13 is carried by a supporting structure 11 (see FIG. 2), which maintains a predefined shape of the magnet 13 and connects the magnet 13 to the positioning unit 29. The supporting structure 11 may be implemented as an iron yoke or a backing plate attached to a surface directed away from the imaging volume 30 of the magnet 13. In one aspect, the supporting structure 11 comprises an adjustment mechanism (not shown) configured to modify a property of the magnetic field (e.g., a primary magnetic field) provided via the field generation unit 12. Preferably, the adjustment mechanism includes or mechanically connects to a magnet, such as a permanent magnet, an electromagnet and/or a superconducting magnet configured to provide a secondary magnetic field. The secondary magnetic field may modify a property of the primary magnetic field when a relative position between the field generation unit 12 and the magnet is changed and/or a current is fed through the magnet. The relative position of the magnet may be adjusted manually and/or automatically via a suitable handle and/or a dedicated drive.

A cross-section of the magnet 13 may comprise a 'U'-shape or a 'Bell'-shape providing an access to the imaging volume 30 in the X-direction and/or the Y-direction (see FIG. 2). A free volume between two flanks of the 'U'-shaped magnet 13 confining the imaging volume 30 may represent an image acquisition region 17 of the magnetic resonance imaging device 10. The image acquisition region 17 may be configured to receive an examination object 15, such as a specific body region of the patient 15 or an animal.

The patient 15 may be positioned within the image acquisition region 17 in an upright or standing position. However, the patient 15 may also be positioned in the image acquisition region 17 in a sitting or lying position. In the latter case, the patient 15 may be positioned by means of a dedicated patient positioning device 34 (see FIG. 4). However, the positioning unit 29 may also be configured to adjust a position and/or an orientation of the field generation unit 12 with respect to the patient 15. For example, the positioning unit 29 may comprise a swivel joint configured to rotate the field generation unit 12 along a rotation direction WX, a rotation direction WZ and/or a rotation direction WY. A position of the field generation unit 12 along a Y-direction, an X-direction and/or a Z-direction may be adjusted via a suitable telescope system and/or rail system of the positioning unit 29. Of course, other aspects of the supporting structure 11 and/or the positioning unit 29 are conceivable. In an aspect, the field generation 12 unit may be tilted via the positioning unit 29 to improve patient access and comfort.

In the shown example, the magnet 13 is a main magnet configured to generate a static magnetic field in the image acquisition region 17. The field generation unit 12 may further comprise a gradient field system 27 (see FIGS. 4 to 6) with at least one gradient coil 28 (see FIGS. 10 and 11) for generating a magnetic gradient field used for spatial encoding of magnetic resonance signals acquired during a magnetic resonance measurement. Preferably, the field generation unit 12 further comprises a radiofrequency system with at least one radiofrequency antenna 19 (see FIGS. 4 to 6) configured to emit a radiofrequency excitation pulse into the image acquisition region 17. The at least one radiofrequency antenna 19 may also be configured to receive magnetic resonance signals from the image acquisition region 17, particularly the imaging volume 30. In one aspect, the at least one radiofrequency antenna 19 may be configured as a local coil.

In order to control the field generation unit 12, the magnetic resonance imaging device 10 comprises a control unit 20. The control unit 20 is configured to control the magnetic resonance imaging device 10 to perform a magnetic resonance measurement of the body region of the patient 15 positioned within the imaging volume 30. For this purpose, the control unit 20 may comprise a signal connection with a gradient control unit 21 and a radiofrequency antenna control unit 22. It is also conceivable, that the gradient control unit 21 and the radiofrequency antenna control unit 22 are integrated within the control unit 20. Furthermore, the control unit 20 may comprise a processing unit 24 configured to coordinate an acquisition of magnetic resonance image data and/or a reconstruction of magnetic resonance image data acquired from the imaging volume 30. It is conceivable, that the processing unit 24 is also configured to evaluate and/or process data, such as magnetic resonance signals and/or magnetic resonance image data. The control unit 20 may comprise a controller, a microcontroller, an analog circuit, a logic unit and the like. The processing unit 24 may comprise a processor, such as a CPU, a GPU and the like. It is also conceivable, that the control unit 20 and/or the processing unit 24 comprise a memory and/or an internal storage, such as a RAM, a ROM, a PROM, an EPROM, an EEPROM, a flash memory, as well as an HDD, an SSD and the like.

Control information, such as imaging parameters and/or magnetic resonance image data, can be displayed on an output unit 25. The output unit 25 may comprise at least one monitor or screen configured to display control information and/or images acquired via the magnetic resonance imaging device 10 to an operator of the magnetic resonance imaging device 10. The magnetic resonance imaging device 10 may further comprise an input unit 26 configured to receive information and/or parameters input by the operator during an imaging examination. Preferably, the output unit 25 and the input unit 26 are part of a user interface 23 configured to control and/or monitor the information related to a magnetic resonance measurement.

The illustrated magnetic resonance imaging device 10 may of course include further components that magnetic resonance imaging devices 10 usually comprise. The general mode of operation of a magnetic resonance imaging device 10 is well-known to the skilled person. Thus, a further description of the general components or a sequencing of a magnetic resonance measurement is not deemed necessary.

Aspects of the magnetic resonance imaging device 10 are configured to perform:
  neurological imaging of the spine of a patient 15, thus enhancing treatment and/or stimulation while scanning; the magnetic resonance imaging device 10 may be used in combination with other sensors like EEG, avoiding contra-indications associated with deep brain stimulators and the like,
  imaging the prostate of a patient 15, wherein an access to the imaging volume 30 is oriented in such a way, that the patient 15 can sit or lie on the magnetic resonance imaging device 10 and to provide an enhanced access to the prostate region, e.g., with the opening 32 oriented upward (e.g., see FIGS. 2, 6, 7); the imaging of the lymph nodes may be accomplished also by re-positioning of the patient 15,
  visualizing body regions of animals, for example extremities of large animals like horses or cows; an opening 32 (see FIGS. 4 to 6) to the imaging volume 30 may be oriented upwards to facilitate placing the animal (e.g., cat, dog, hamster, etc.) on appropriate positioning aids and cushions.

Due to an enhanced openness, the disclosed magnetic resonance imaging device 10 may easily be combined with other imaging modalities, such as flatbed or C-arm X-ray scanners, ultrasound scanners, as well as optical imaging devices. Other imaging modalities may even be used to improve results of a magnetic resonance measurement by providing high resolution navigator signals and facilitate data fusing.

FIG. 2 depicts an aspect of the disclosed magnetic resonance imaging device 10, wherein a plurality of positioning aids 14a, 14b, 14c and 14d (14a-d) support a patient 15 in maintaining a correct posture for a magnetic resonance measurement of the prostate. The two positioning aids 14a and 14b are configured for supporting the arms and the feet of the patient 15 in a predetermined position over the course of the magnetic resonance measurement. In the shown example, a position and/or orientation of the positioning aids 14a and 14b may be adapted automatically via the control unit 20. For this purpose, the processing unit 24 may receive a body height, a body weight, a gender, an age and/or other patient information from a source (e.g., a hospital information system) and output control information to the control unit 20 in dependence of the patient information. The control unit 20 may output a control signal to a drive of an adjustment unit (not shown), which change the position and/or orientation of the positioning aids 14 according to the control information. In contrast, the positioning aids 14c and 14d may be cushions, which passively support the patient 15 to maintain the correct posture. Preferably, the positioning aids 14c and 14d comprise a hard foam preventing the patient from moving during the magnetic resonance measurement.

In the shown example, the field generation unit 12 comprises a magnet 13 as well as a first gradient coil 28a and a second gradient coil 28b. The first gradient coil 28a and the second gradient coil 28b are positioned adjacent to the surface directed towards the imaging volume 30 of the magnet 13. In the aspect shown in FIG. 2, the correct posture requires the patient 15 to be seated upon the surface directed towards the imaging volume 30 of the gradient coil 28a in such a way, that the prostate and/or nearby lymph nodes are covered by the imaging volume 30. To increase patient comfort, the shape of the surface directed towards the imaging volume 30 of the magnet 13, the gradient coil 28 and the gradient coil 28b preferably follow a concave shape ("U-shape") in an anterior-posterior direction of the patient 15 and a convex shape in a left-right direction of the patient 15. It is conceivable, that the magnet 13 is tilted with respect to an essentially horizontal floor of an examination room in order to support the patient 15 in accessing the imaging volume 30 and/or maintaining the correct position.

FIG. 3 shows a top view of an alternative aspect of the disclosed magnetic resonance imaging device 10 shown in FIG. 2. The magnet 13 comprises two recesses 33a and 33b configured for accommodating the legs of the patient 15. The recesses 33a and 33b are shifted with respect to the imaging volume 30 along the Z-direction. Thus, the legs protruding forward from the patient 15 may comfortably be positioned within the recesses 33a and 33b. Of course, a shape of the recesses 33a and 33b and/or a relative position of the recesses 33a and 33b with respect to the magnet 13 may vary to account for specific groups of patients (e.g., children, women, men, elderly people) and/or different patient physiques.

Figure 4:
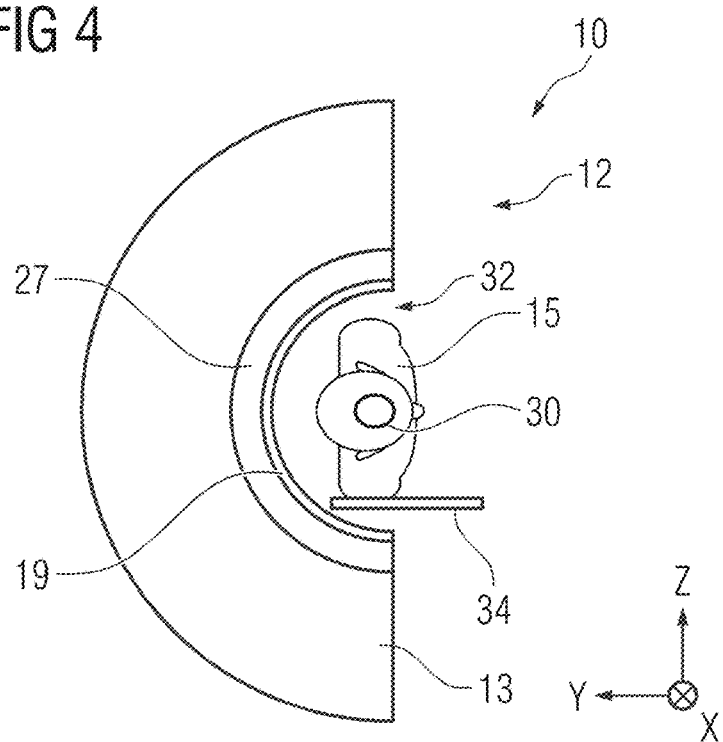

FIG. 4 depicts an aspect of the disclosed magnetic resonance imaging device 10, wherein the patient 15 is positioned on one side in a lateral decubitus position. Positioning the patient 15 in a lateral decubitus position has the advantage of providing a particularly comfortable but also stable position of the patient 15 during the magnetic resonance measurement. The patient 15 may be rested upon a patient positioning device 34, which may be configured to adjust a relative position between the patient 15 and the field generation unit 12, at least along a horizontal line oriented substantially in parallel to a sagittal plane of the patient 15. Thus, a plurality of target anatomies, such as the prostate, the spine and/or the brain of the patient 15, may be examined using the disclosed magnetic resonance imaging device 10.

It is also conceivable, that a plurality of target anatomies and/or sections of one target anatomy is examined in multiple steps, e.g., by continuously or discontinuously changing the relative position between the patient 15 and the field generation unit 12 during the magnetic resonance measurement. In an aspect, the patient 15 can be moved relative to the field generation unit 12 in order to successively cover a target anatomy. The succession of coverage may take place in a cranial or caudal direction along a target anatomy as depicted in FIG. 4. However, the succession of coverage may also take place in an anterior-posterior direction as well as a left-right direction. It is also conceivable, that the succession of coverage may comprise a tilting of the field generation unit 12 with respect to the patient 15 along a WX-direction, a WY-direction and/or a WZ-direction as shown in FIG. 1. In one aspect, the magnetic resonance imaging device 10 may be configured to perform multi-slab, or more generally, multi-position imaging. Multi-slab or multi-position imaging may comprise performing a magnetic resonance measurement of a volume or a target anatomy which is larger than the imaging volume 30. For this purpose, a relative position between the field generation unit 12 and the imaging object may be changed continuously or discontinuously during the magnetic resonance measurement.

In the depicted aspect, the field generation unit 12 comprises a gradient field system 27 comprising one or more gradient coils 28, as well as a radiofrequency antenna 19. A surface directed towards the imaging volume 30 of the radiofrequency antenna 19 may comprise a concave shape which is matched with a concave shape of the surface directed towards the imaging volume 30 of the gradient field system 27 and/or the magnet 13.

Figure 5:
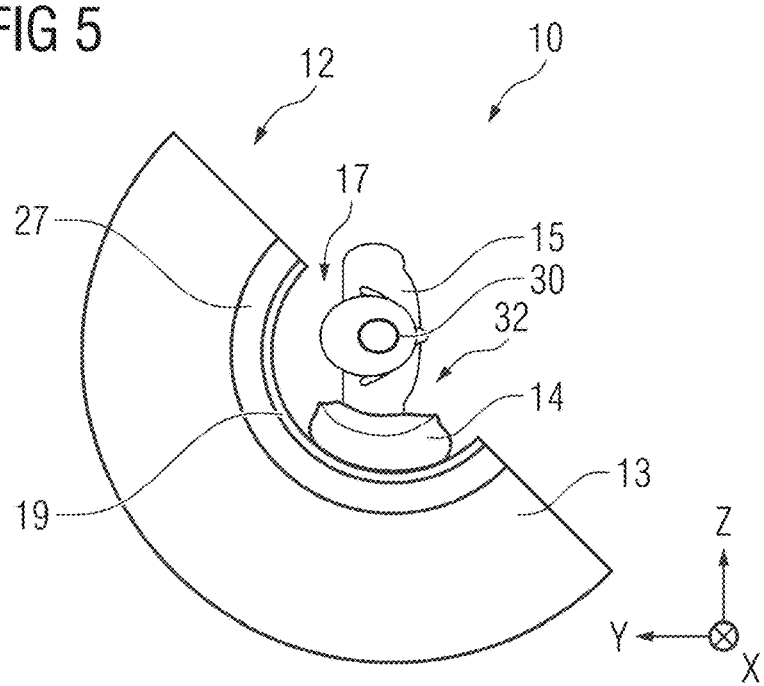

FIG. 5 shows an aspect of the disclosed magnetic resonance imaging device 10, wherein the field generation unit 12 is tilted or rotated with respect to the aspect shown in FIG. 4. It is conceivable, that the positioning unit 29 (not shown) is configured to tilt or rotate the field generation unit 12 in order to facilitate an access of the patient 15 to the imaging volume and/or increase comfort of the patient 15 during the magnetic resonance measurement. As shown in FIG. 5, the patient 15 may rest on a positioning aid 14 inside the imaging acquisition region 17. However, it is also conceivable, that the patient 15 rests upon a surface of the field generation unit 12 or a patient positioning device 34 (see FIG. 4) positioned within the image acquisition region 17.

Figure 6:
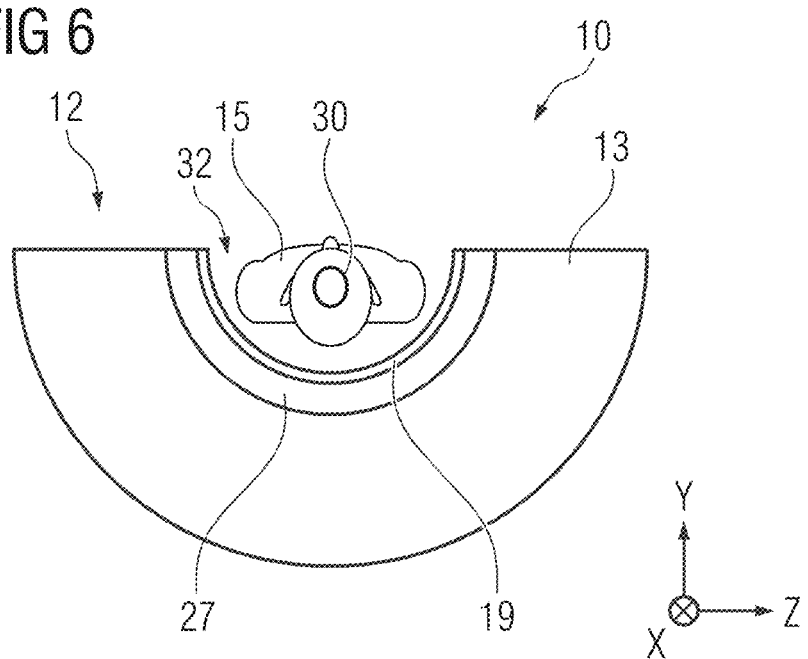

FIG. 6 shows a further aspect of the disclosed magnetic resonance imaging device 10. In the present example, an opening of the magnet 13 is directed upwards (e.g., in the Y-direction) in such a way, that the patient 15 may access the imaging volume 30 along the Y-direction and/or the X-direction. During a magnetic resonance measurement, the patient 15 may rest on the back in a lying position. The patient 15 may be supported via a positioning aid 14 as shown in FIGS. 2 and 5. The depicted posture of the patient 15 may correspond to a correct posture for performing a magnetic resonance measurement of the spine of the patient 15. The field generation unit 12 favorably provides an increased openness for using intervention and/or therapy instruments while simultaneously performing the magnetic resonance measurement. The increased openness of the field generation unit 12 may also facilitate an access to the imaging volume 30 and/or provide a robust and/or comfortable position, which the patient 15 may easily maintain during the magnetic resonance measurement. However, the magnet 13 may still enclose the imaging volume 30 and/or the patient 15 in such a way, to provide sufficient coverage of the imaging volume 30 and/or the patient 15 with magnetic material and to generate an appropriate B0 magnetic field for performing a magnetic resonance measurement.

Figure 7:
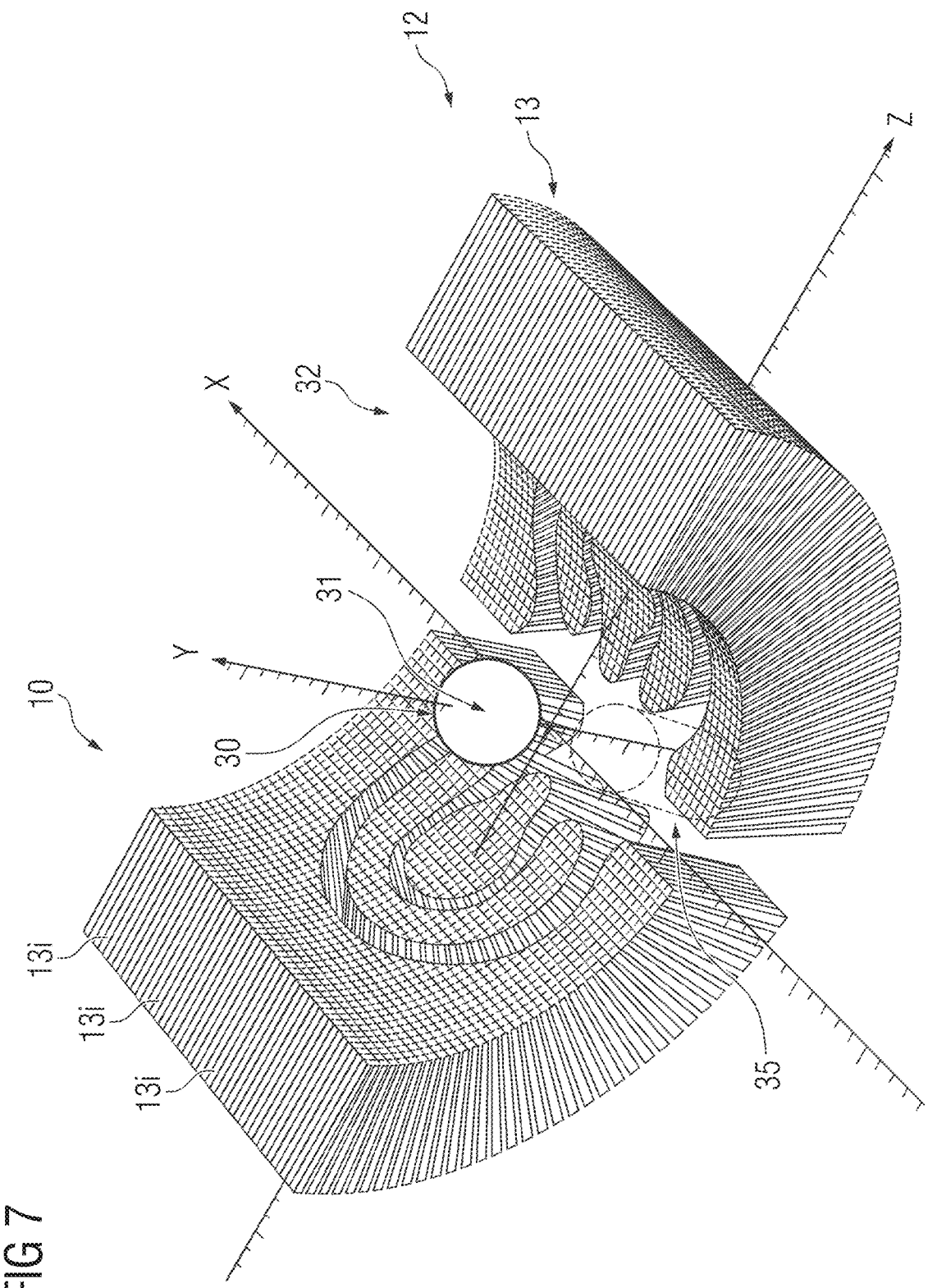

FIG. 7 shows an aspect of the disclosed magnetic resonance imaging device 10, wherein the magnet 13 comprises a plurality of smaller permanent magnets 13i. In the depicted example, the permanent magnets 13i are bar magnets which are oriented radially with respect to the center of the imaging volume 31. The permanent magnets 13i are arranged in such a way to provide a concave surface directed towards the imaging volume 30.

To generate a homogenous main magnetic field within the imaging volume, it may be beneficial to increase a density of magnetic material (e.g., a number and/or density of permanent magnets, resistive coils or superconducting material) in the flanks of the 'U'-shaped magnet 13 in comparison to a nook positioned directly below the imaging volume 30 along the Y-direction. It is also conceivable, that a reduction of magnetic material in a region below the imaging volume 30 (e.g., along the Y-direction) does not overly compromise or constrain a provision of a homogenous main magnetic field within the imaging volume 30. Thus, the concept of increasing the density of magnetic material in the outer flanks of the concave or 'U'-shaped magnet 13 may also represent a design criterium for gradient coils 28 as well as radiofrequency antennas 19 positioned adjacent to the magnet 13. Furthermore, decreasing the density of magnetic material in the nook below the imaging volume 30 may favorably facilitate implementing recesses 33 (see FIG. 3) in the magnet 13, the gradient coil(s) 28 and/or the radiofrequency antenna(s) 19 when designing an disclosed magnetic resonance imaging device 10 which is configured to accommodate the patient 15 in a sitting position as shown in FIG. 2.

As a further advantage, regions with lower density of magnetic material are well suited for implementing a hole 35 passing through the field generation unit 12. The hole 35 may be used to introduce medical instruments, such as needles, catheters and/or local coils, to the imaging volume 30 from a back side of the magnet 13.

In one aspect, the permanent magnets 13i of the magnet 13 are arranged in such a way to circumvent the recesses 33a and 33b for accommodating the legs of a patient 15. Furthermore, a surface area of the concave surface directed towards the imaging volume 30 may be different, particularly smaller, than the surface area of the surface directed away from the imaging volume 30. The cross-sections of the permanent magnets 13i may taper down in a direction from a point on the surface directed away from the imaging volume 30 towards the center of the imaging volume 31. It is also conceivable, that a spacing between individuals permanent magnets 13i decreases in the same direction. Thus, the density of magnetic material may increase in the direction towards the imaging volume 30 and decrease in the direction towards the nook of the concave shaped magnet 13.

Figure 8:
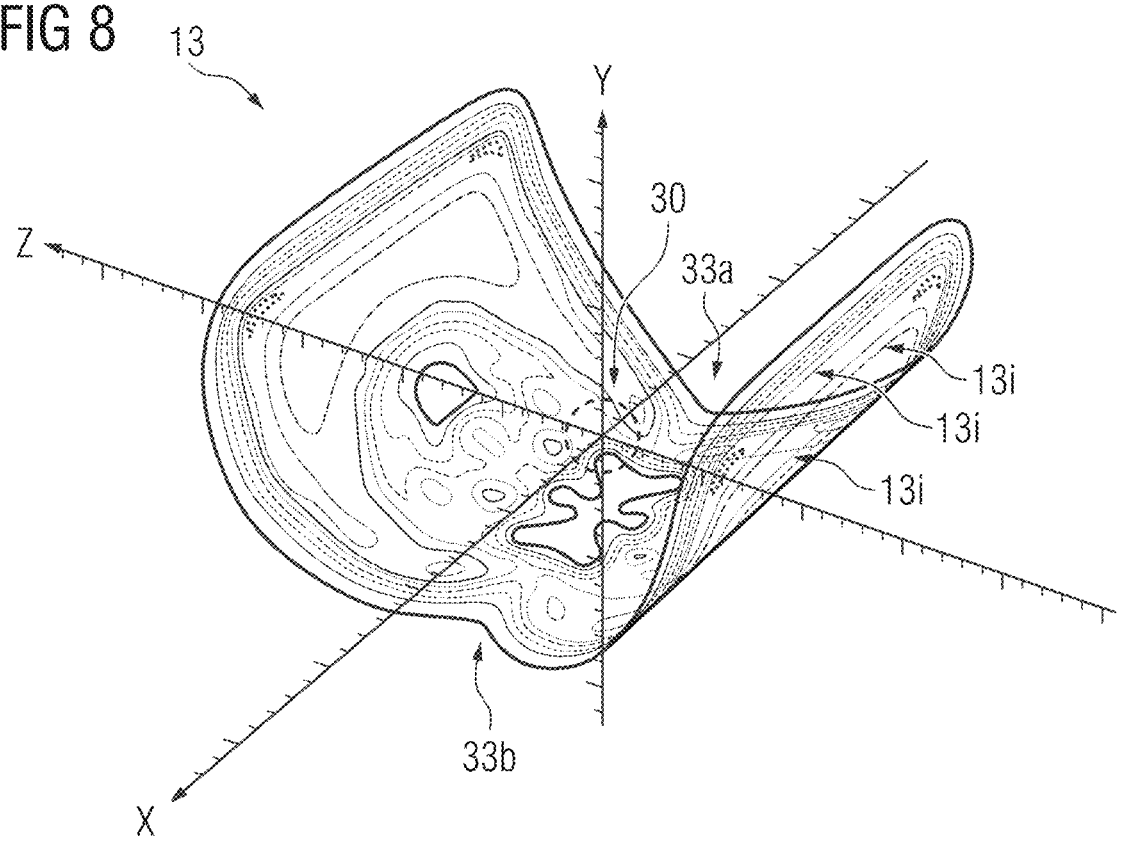

FIG. 8 shows an aspect wherein the magnet 13 is a superconducting magnet 13 comprising coils of superconducting wire 13i. The superconducting wire 13i may consist of a high temperature superconductor or a low temperature superconductor connected to a cryostat (not shown) to keep a temperature of the superconducting magnet 13 below a predefined value. The superconducting wire 13i is essentially arranged in in a curved plane providing a concave surface directed towards the imaging volume 30. Furthermore, the superconducting wire 13i is arranged in such a way to circumvent the two recesses 33a and 33b configured for accommodating the legs of a patient 15. The superconducting magnet 13 may further comprise a hole 35, which may be located in a region of a nook of the concave surface of the magnet 13 (where the density of superconducting wire 13i may be low). Thus, medical instruments may be introduced to the imaging volume 30 from a surface directed way from the imaging volume 30 of the magnet 13.

Figure 9:
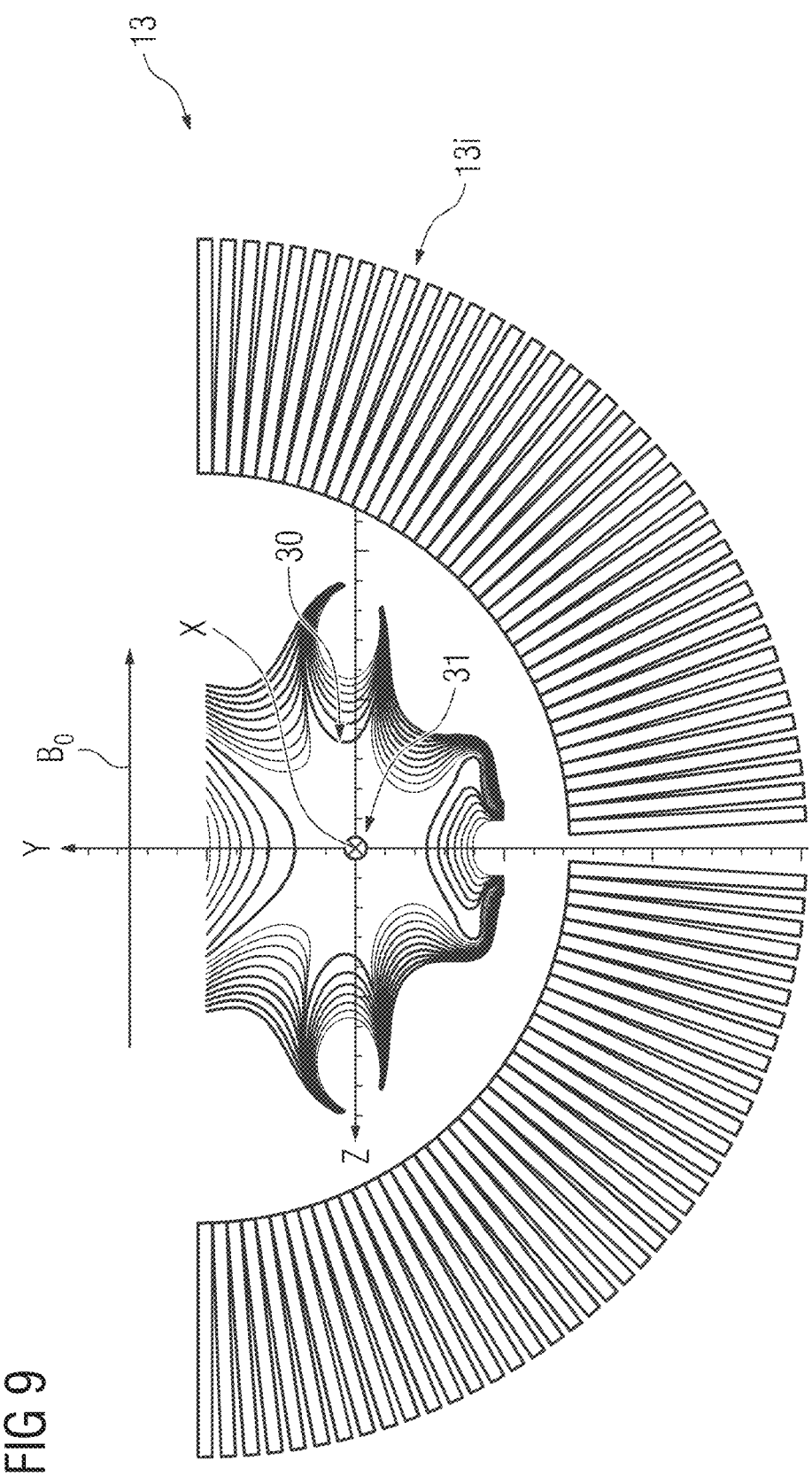

FIG. 9 depicts an alternative aspect of a magnet 13 providing an imaging volume 30 with a complex three-dimensional shape. The shape of the imaging volume 30 is particularly suited for performing a magnetic resonance measurement of the jaw region and/or the teeth of the patient 15, as the magnetic field lines follow a shape of a dental arch, when moving from the center of the imaging volume 31 in the Y-direction. However, the disclosed magnetic resonance imaging device 10 may also comprise a differently shaped imaging volume 30, e.g., an ellipsoidal, an ovoid or a spherical imaging volume.

The main direction of magnetic field lines within the imaging volume 30, particularly the magnetic field lines of the static magnetic field (BO field) provided via the magnet 13, may be oriented along the Z-direction. A patient 15 may choose to access the imaging volume 30 along one of two perpendicular spatial directions, such as the X-direction and the Y-direction. However, the access to the imaging volume 30 is not limited by these two spatial directions. A magnetic resonance imaging device 10 according to an aspect described above may also enable the patient 15 to access the imaging volume 30 along three perpendicular spatial directions.

Figure 10:
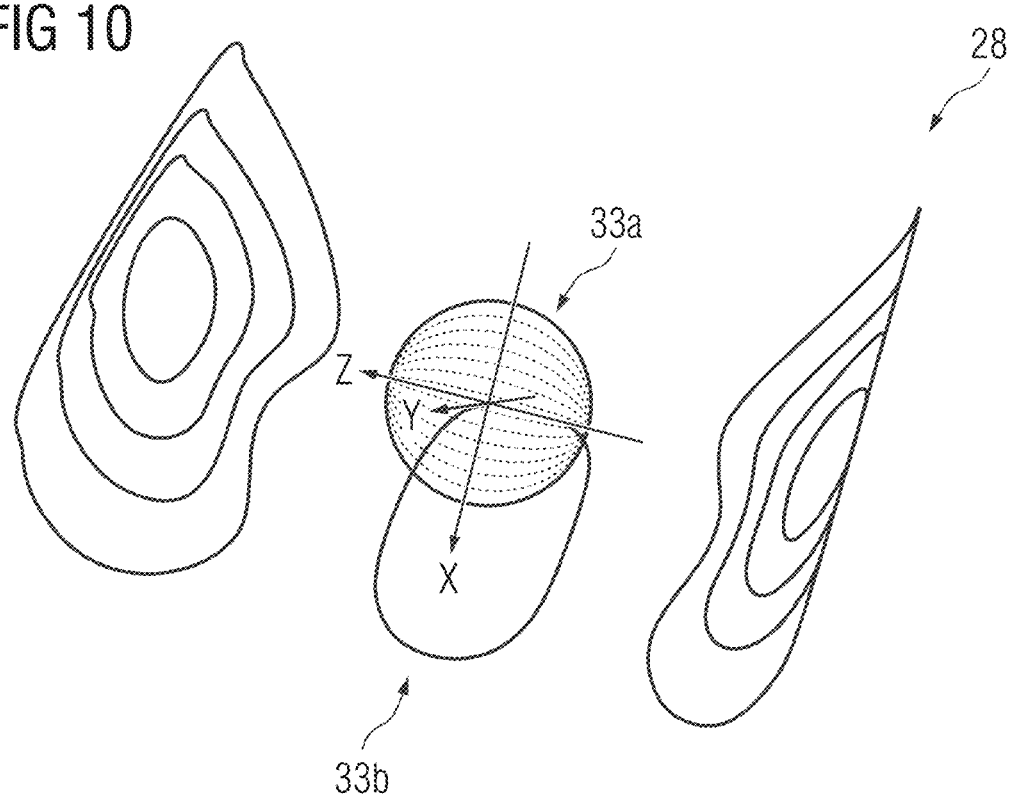

FIG. 10 depicts an aspect of a gradient coil 28 positioned adjacent to the surface directed towards the imaging volume 30 of the magnet 13. As shown, the gradient coil 28 may comprise a plurality of coils or wires, which are arranged in a curved plane. The depicted gradient coil 28 may be first gradient coil (e.g., a Z-axis gradient coil) configured to provide a magnetic gradient field oriented along the Z-direction. Furthermore, the first gradient coil 28 may comprise two recesses 33a and 33b configured for accommodating the legs of a patient 15 positioned in the correct posture as shown in FIG. 2.

Figure 11:
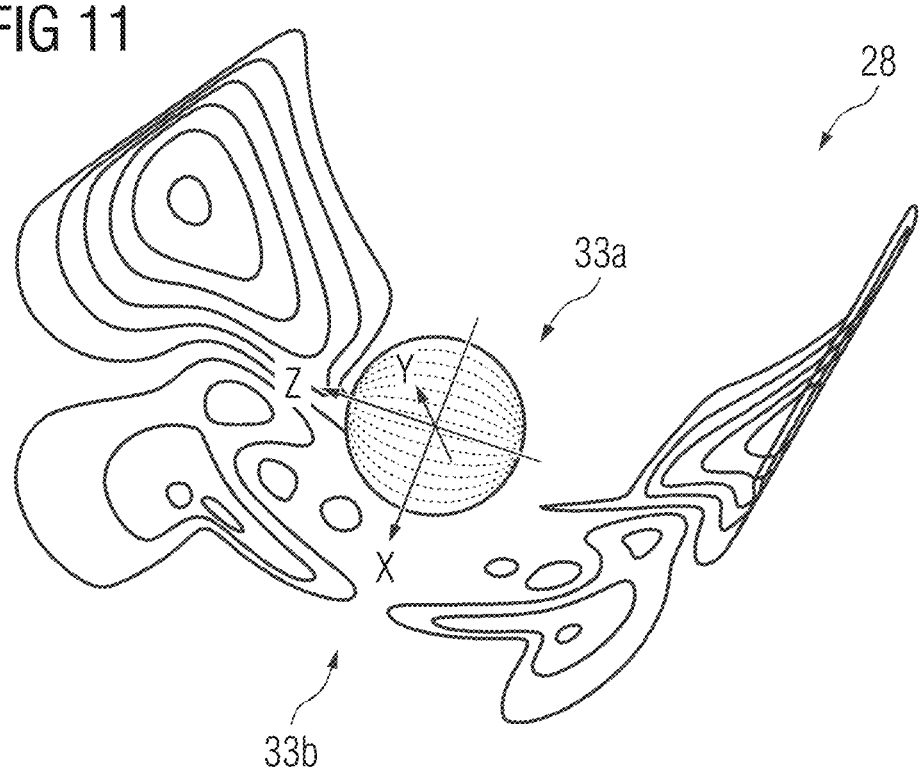

FIG. 11 depicts an aspect of an alternative gradient coil 28 positioned adjacent to the surface directed towards the imaging volume 30 of the magnet 13 and/or a surface of the first gradient coil 28. Analogous to the aspect shown in FIG. 10, the alternative gradient coil 28 may comprise a plurality of coils or wires, which are arranged in a curved plane. The alternative gradient coil 28 may be a second gradient coil (e.g., an X-axis gradient coil) configured to provide a magnetic gradient field along the Y-direction. The plurality of coils or wires of the second gradient coil 28 may be arranged in such a way to circumvent the two recesses 33a and 33b configured for accommodating the legs of a patient 15.

With respect to FIGS. 10 and 11, the Z-axis and the X-axis may be positioned in such a way that the Z-axis gradient coil 28 and the X-axis gradient coil 28 are arranged symmetrically with respect to a plane oriented in parallel to the X-axis and the Y-axis. Instead of arranging the Z-axis gradient coil 28 and the X-axis gradient coil 28 in such a way, that one transversal axis directs along the concave surface of the magnet 13 (e.g., along the U-profile), and the other is oriented radially to the nook of the concave shaped surface, a rotation of the coordinate system by 45° around the Z-direction may allow for a provision of a more balanced gradient coil.

The disclosed magnetic resonance imaging device 10 may further comprise a third gradient coil (not shown) configured to provide a magnetic gradient field oriented along the Y-direction (e.g., a Y-axis gradient coil). In one aspect, a winding pattern of the third gradient coil may be similar to the winding pattern of the second gradient coil 28. However, the winding pattern of third gradient coil may be inversed or reflected in comparison to the winding pattern of the second gradient coil 28 shown in FIG. 11.

With further reference to FIG. 2, an order or a sequence of the first gradient coil 28, the second gradient coil 28 and/or the third gradient coil with respect to a distance to the imaging volume 30 (or a distance to the surface directed towards the imaging volume 30 of the magnet 13) may be arbitrary. For example, the first gradient coil 28 may be positioned on the surface directed towards the imaging volume 30 of the magnet 13, whereas the second gradient coil 28 is positioned on a surface directed towards the imaging volume 30 of the first gradient coil 28. It is also conceivable, that the second gradient coil 28 is positioned on the surface directed towards the imaging volume 30 of the magnet 13, whereas the first gradient coil 28 is positioned on the surface directed towards the imaging volume 30 of the second gradient coil 28. The third gradient coil 28 may be positioned adjacent to the magnet 13, the first gradient coil 28 and/or the second gradient coil 28. With respect to FIG. 6, the disclosed magnetic resonance imaging device 10 may also comprise a radiofrequency antenna 19. Preferably, the radiofrequency antenna 19 is positioned closest (in comparison to the magnet 13 and/or the gradient coils 28) to the patient 15 to enhance a signal-to-noise-ratio of magnetic resonance signals acquired from the imaging volume 30.

According to FIGS. 7 to 11, a region with decreased density of conductors or magnetic material can be located in the nook below the imaging volume 30. This region can favorably be used for provision of a hole 35 passing through the field generation unit 12 (e.g., the magnet 13 and each layer of gradient coils 28 and/or radiofrequency antennas 19). The hole 35 may provide space for intervention equipment and/or an additional diffusion-gradient system (not shown) that produces strong fields for diffusion pulses.

FIG. 12 shows an aspect, wherein the magnet 13 comprises a rotationally symmetric, hyperboloid shape. As depicted in FIG. 12, the constriction area or tapered area of the magnet 13 may constitute the at least one recess 33 configured to accommodate a leg of the patient 15. The imaging volume 30 may circumferentially enclose the magnet 13 along at least a section of an axis of rotational symmetry of the magnet 13. Particularly, the imaging volume 30 may comprise a toroidal shape.

The aspects described above are to be recognized as examples. Individual aspects may be extended by features of other aspects.

The invention claimed is:

1. A magnetic resonance imaging device, comprising:
a field generation unit configured to provide a magnetic field in an imaging volume of the magnetic resonance imaging device, and comprising at least one magnet,
wherein a surface of the field generation unit directed towards the imaging volume of the at least one magnet comprises a concave shape, and a direction of access to the imaging volume is oriented essentially perpendicular to a main direction of magnetic field lines in the imaging volume, and
wherein the at least one magnet is configured to accommodate a patient in a sitting position on the surface directed towards the imaging volume, and the at least one magnet comprises at least one recess configured to accommodate a leg of the patient positioned in the sitting position.

2. The magnetic resonance imaging device according to claim 1, wherein the at least one magnet is configured to provide access to the imaging volume along at least two perpendicular spatial directions, and each of the two perpendicular spatial directions is oriented essentially perpendicular to the main direction of magnetic field lines in the imaging volume.

3. The magnetic resonance imaging device according to claim 1, wherein the field generation unit comprises an adjustment mechanism configured to adjust a position and/or orientation of at least a part of the field generation unit and modify a property of the magnetic field provided via the field generation unit, and the property of the magnetic field comprises at least one of a shape of the imaging volume, a position of the imaging volume, a magnetic field strength and/or a direction of magnetic field lines.

4. The magnetic resonance imaging device according to claim 1,
wherein the at least one magnet comprises an element selected from a group consisting of: a permanent magnet, an array of permanent magnets, a resistive coil, an array of resistive coils, a high temperature superconductor, and a low temperature superconductor, and
wherein the surface directed towards the imaging volume of the at least one magnet corresponds to a pole face of the at least one magnet and/or a surface of a material of the at least one magnet configured to provide a magnetic field.

5. The magnetic resonance imaging device according to claim 1, wherein the surface directed towards the imaging volume of the at least one magnet comprises a hole, and the hole is configured to provide an access to the imaging volume from a side of the at least one magnet, which is directed away from the imaging volume.

6. The magnetic resonance imaging device according to claim 1, wherein the field generation unit comprises a gradient field system including at least one gradient coil, which is configured to provide a magnetic gradient field within the imaging volume, wherein a surface directed towards the imaging volume of the at least one gradient coil comprises a concave shape, and wherein the at least one gradient coil is positioned adjacent to the surface directed towards the imaging volume of the at least one magnet.

7. The magnetic resonance imaging device according to claim 6, wherein the at least one gradient coil comprises at least one recess configured to accommodate a leg of the patient.

8. The magnetic resonance imaging device according to claim 6, wherein the field generation unit comprises a hole passing through the at least one gradient coil and the at least one magnet, and the hole is configured to provide an access to the imaging volume from a side of the at least one magnet directed away from the imaging volume.

9. The magnetic resonance imaging device according to claim 1, wherein the field generation unit comprises a gradient field system including at least one gradient coil, wherein the at least one gradient coil is recessed into the surface directed towards the imaging volume of the at least one magnet, wherein the at least one gradient coil is configured to provide a magnetic gradient field within the imaging volume, and wherein the surface directed towards the imaging volume of the at least one magnet corresponds to a pole face of the at least one magnet and/or a surface of a material of the at least one magnet configured to provide a magnetic field.

10. A magnetic resonance imaging device, comprising:
a field generation unit configured to provide a magnetic field in an imaging volume of the magnetic resonance imaging device, and comprising at least one magnet,
wherein a surface of the field generation unit directed towards the imaging volume of the at least one magnet comprises a concave shape, and a direction of access to the imaging volume is oriente dessentially perpendicular to a main direction of magnetic field lines in the imaging volume;
a positioning aid configured to support a patient in maintaining a correct posture for performing a magnetic resonance imaging measurement,
wherein the correct posture is characterized by a predefined relative position between the patient and the magnetic resonance imaging device, and at least a part of a target anatomy of the patient is covered by the imaging volume when the patient is positioned in the correct posture and
wherein the positioning aid comprises:
an adjustment unit configured to adjust a position and/or an orientation of the positioning aid relative to the at least one magnet; and
a processing unit configured to receive patient information and control the adjustment unit to adapt the position and/or orientation of the positioning aid in dependence of the patient information.

11. A magnetic resonance imaging device, comprising:
a field generation unit configured to provide a magnetic field in an imaging volume of the magnetic resonance imaging device, and comprising at least one magnet,
wherein a surface of the field generation unit directed towards the imaging volume of the at least one magnet comprises a concave shape, and a direction of access to the imaging volume is oriented essentially perpendicular to a main direction of magnetic field lines in the imaging volume,
wherein the surface directed towards the imaging volume of the at least one magnet is shaped to match at least a part of a contour of a body region of a patient,
wherein the body region of the patient is selected from a group of body regions consisting of: s spinal region, a facial region, a pelvic region, a breast region, an abdominal region, and an extremity of the patient, and
wherein the surface directed towards the imaging volume of the at least one magnet is shaped to match a contour of the pelvic region of the patient and configured to accommodate the patient in a sitting position, and at least a part of a prostate and/or a lymph node in proximity to the prostate of the patient is positioned within the imaging volume, when the patient is positioned in the sitting position.

12. The magnetic resonance imaging device according to claim 11, wherein the at least one magnet is configured to provide access to the imaging volume along at least two perpendicular spatial directions, and each of the two perpendicular spatial directions is oriented essentially perpendicular to the main direction of magnetic field lines in the imaging volume.

13. The magnetic resonance imaging device according to claim 11, wherein the field generation unit comprises an adjustment mechanism configured to adjust a position and/or orientation of at least a part of the field generation unit and modify a property of the magnetic field provided via the field generation unit, and the property of the magnetic field comprises at least one of a shape of the imaging volume, a position of the imaging volume, a magnetic field strength and/or a direction of magnetic field lines.

14. The magnetic resonance imaging device according to claim 11,
wherein the at least one magnet comprises an element selected from a group consisting of: a permanent magnet, an array of permanent magnets, a resistive coil, an array of resistive coils, a high temperature superconductor, and a low temperature superconductor, and
wherein the surface directed towards the imaging volume of the at least one magnet corresponds to a pole face of the at least one magnet and/or a surface of a material of the at least one magnet configured to provide a magnetic field.

15. The magnetic resonance imaging device according to claim 11, wherein the surface directed towards the imaging volume of the at least one magnet comprises a hole, and the hole is configured to provide an access to the imaging volume from a side of the at least one magnet, which is directed away from the imaging volume.

16. The magnetic resonance imaging device according to claim 11, wherein the field generation unit comprises a gradient field system including at least one gradient coil, which is configured to provide a magnetic gradient field within the imaging volume, wherein a surface directed towards the imaging volume of the at least one gradient coil comprises a concave shape, and wherein the at least one gradient coil is positioned adjacent to the surface directed towards the imaging volume of the at least one magnet.

17. The magnetic resonance imaging device according to claim 16, wherein the at least one gradient coil comprises at least one recess configured to accommodate a leg of the patient.

18. The magnetic resonance imaging device according to claim 16, wherein the field generation unit comprises a hole passing through the at least one gradient coil and the at least one magnet, and the hole is configured to provide an access to the imaging volume from a side of the at least one magnet directed away from the imaging volume.

19. The magnetic resonance imaging device according to claim 11, wherein the field generation unit comprises a gradient field system including at least one gradient coil, wherein the at least one gradient coil is recessed into the surface directed towards the imaging volume of the at least one magnet, wherein the at least one gradient coil is configured to provide a magnetic gradient field within the imaging volume, and wherein the surface directed towards the imaging volume of the at least one magnet corresponds to a pole face of the at least one magnet and/or a surface of a material of the at least one magnet configured to provide a magnetic field.

20. A magnetic resonance imaging device, comprising:
a field generation unit configured to provide a magnetic field in an imaging volume of the magnetic resonance imaging device, and comprising at least one magnet,
wherein a surface of the field generation unit directed towards the imaging volume of the at least one magnet comprises a concave shape, and a direction of access to the imaging volume is oriented essentially perpendicular to a main direction of magnetic field lines in the imaging volume, and wherein the at least one magnet comprises the shape of a hyperboloid, and the at least one magnet is configured to provide a toroidal imaging volume circumferentially enclosing the at least one magnet along at least a section of the at least one magnet.

* * * * *